United States Patent
Zhang et al.

(10) Patent No.: US 10,424,387 B1
(45) Date of Patent: Sep. 24, 2019

(54) REDUCING WIDENING OF THRESHOLD VOLTAGE DISTRIBUTIONS IN A MEMORY DEVICE DUE TO TEMPERATURE CHANGE

(71) Applicant: SanDisk Technologies LLC, Plano, TX (US)

(72) Inventors: Zhengyi Zhang, Mountain View, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/981,024

(22) Filed: May 16, 2018

(51) Int. Cl.
  *G11C 16/06* (2006.01)
  *G11C 16/34* (2006.01)
  *G11C 16/10* (2006.01)
  *G11C 16/04* (2006.01)

(52) U.S. Cl.
  CPC ...... *G11C 16/3459* (2013.01); *G11C 16/0483* (2013.01); *G11C 16/10* (2013.01)

(58) Field of Classification Search
  CPC .. G11C 16/3459; G11C 16/0483; G11C 16/10
  See application file for complete search history.

(56) References Cited

U.S. PATENT DOCUMENTS

| 8,391,070 | B2 | 3/2013 | Bathul et al. |
| 8,432,740 | B2 | 4/2013 | Li |
| 8,743,606 | B2 | 6/2014 | Dutta et al. |
| 8,879,330 | B1 * | 11/2014 | Mu ................ G11C 16/3445 365/185.22 |
| 8,902,668 | B1 | 12/2014 | Dutta et al. |
| 8,929,142 | B2 | 1/2015 | Dong et al. |
| 9,142,315 | B2 | 9/2015 | Mu et al. |
| 9,208,876 | B1 | 12/2015 | Cheng et al. |
| 9,424,931 | B2 * | 8/2016 | Choi ................ G11C 16/10 |
| 9,711,211 | B2 | 7/2017 | Masuduzzaman et al. |
| 2006/0285408 | A1 * | 12/2006 | Betser ............ G11C 16/3404 365/212 |
| 2012/0218823 | A1 | 8/2012 | Tanzawa |
| 2013/0163342 | A1 | 6/2013 | Dutta |

(Continued)

OTHER PUBLICATIONS

International Search Report & The Written Opinion of the International Searching Authority dated May 24, 2019, International Application No. PCT/US2019/017068.

*Primary Examiner* — Pho M Luu
(74) *Attorney, Agent, or Firm* — Vierra Magen Marcus LLP

(57) ABSTRACT

Apparatuses and techniques are described for programming a memory device with reduced temperature-based changes in the threshold voltage distribution (Vth). Different memory cells can have different values of a temperature coefficient, Tco, and high-Tco memory cells may tend to be at the lower tail of a Vth distribution. The memory cells are programmed using a first set of verify voltages which are temperature-independent. If the temperature at the time of the programming is less than a specified temperature, the high-Tco memory cells are identified and programmed further in a second pass using a second set of verify voltages which are temperature-dependent. Further, the second pass is configured to provide a narrower Vth distribution width than the first program pass. The second pass may use a smaller program pulse step size and/or an elevated bit line voltage.

20 Claims, 21 Drawing Sheets

(56) References Cited

U.S. PATENT DOCUMENTS

| | | |
|---|---|---|
| 2013/0308390 A1 | 11/2013 | Lee |
| 2014/0204694 A1* | 7/2014 | Choy .................. G11C 16/345 365/211 |
| 2016/0125935 A1 | 5/2016 | Lee |
| 2016/0172051 A1 | 6/2016 | Liang et al. |

* cited by examiner

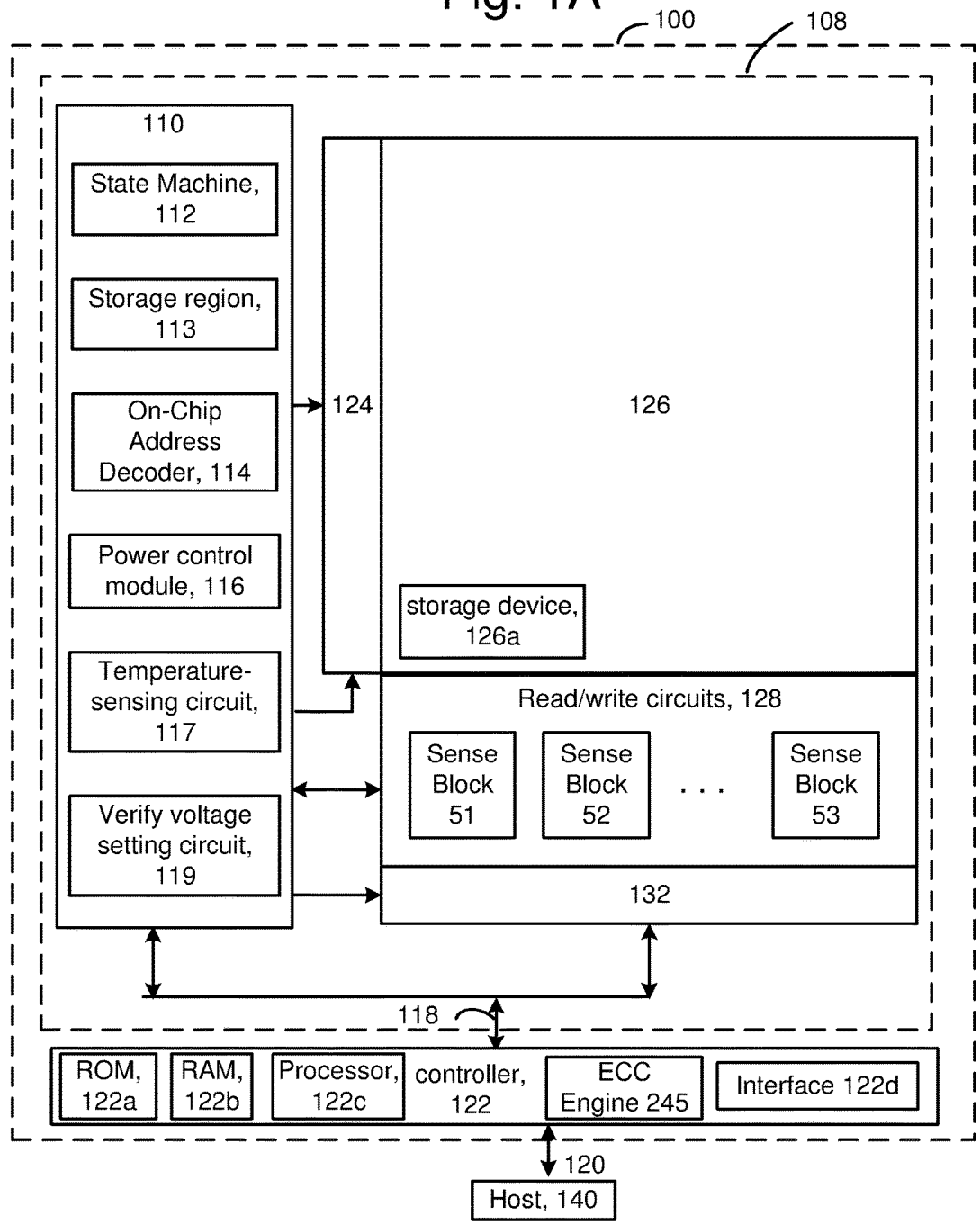

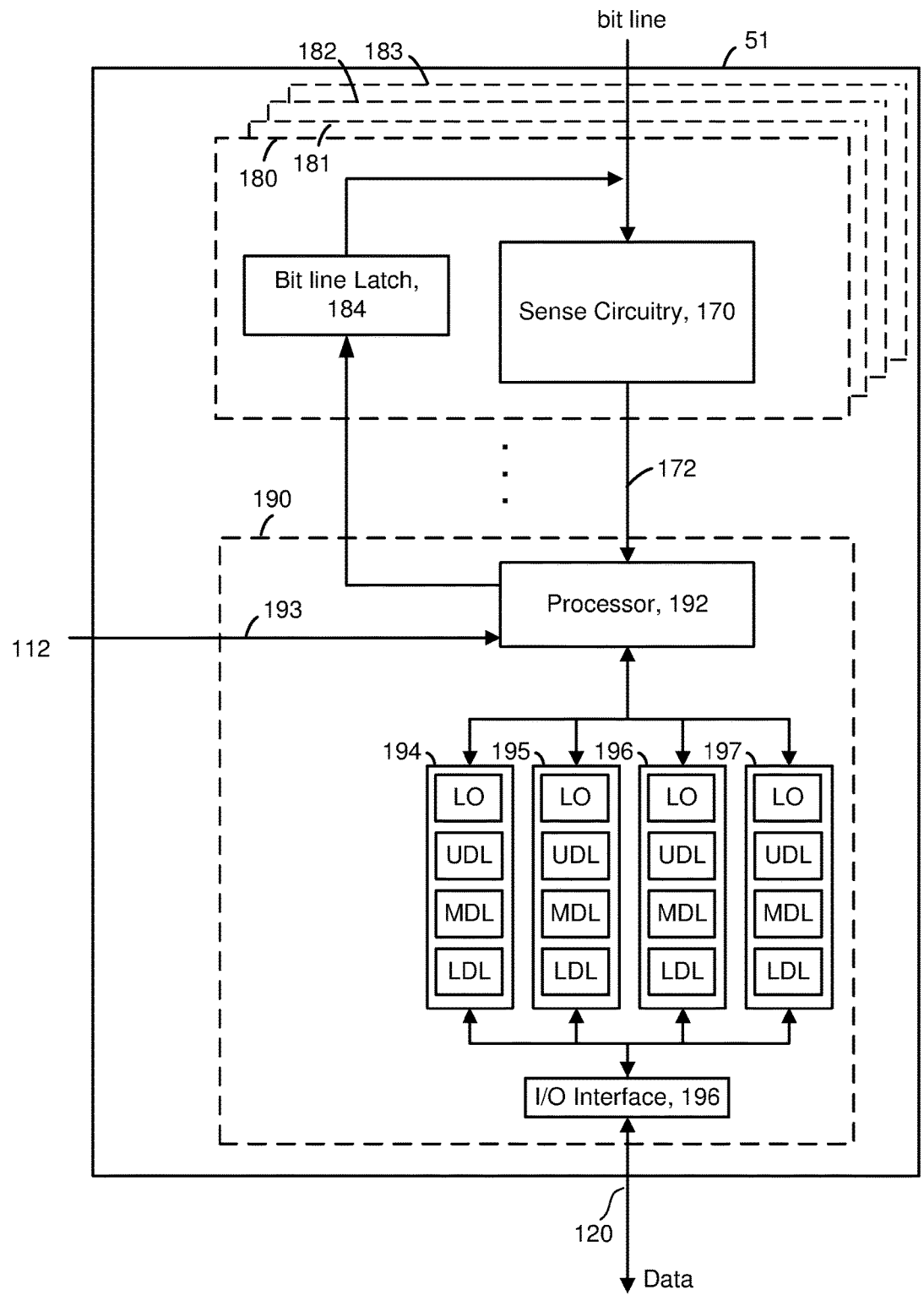

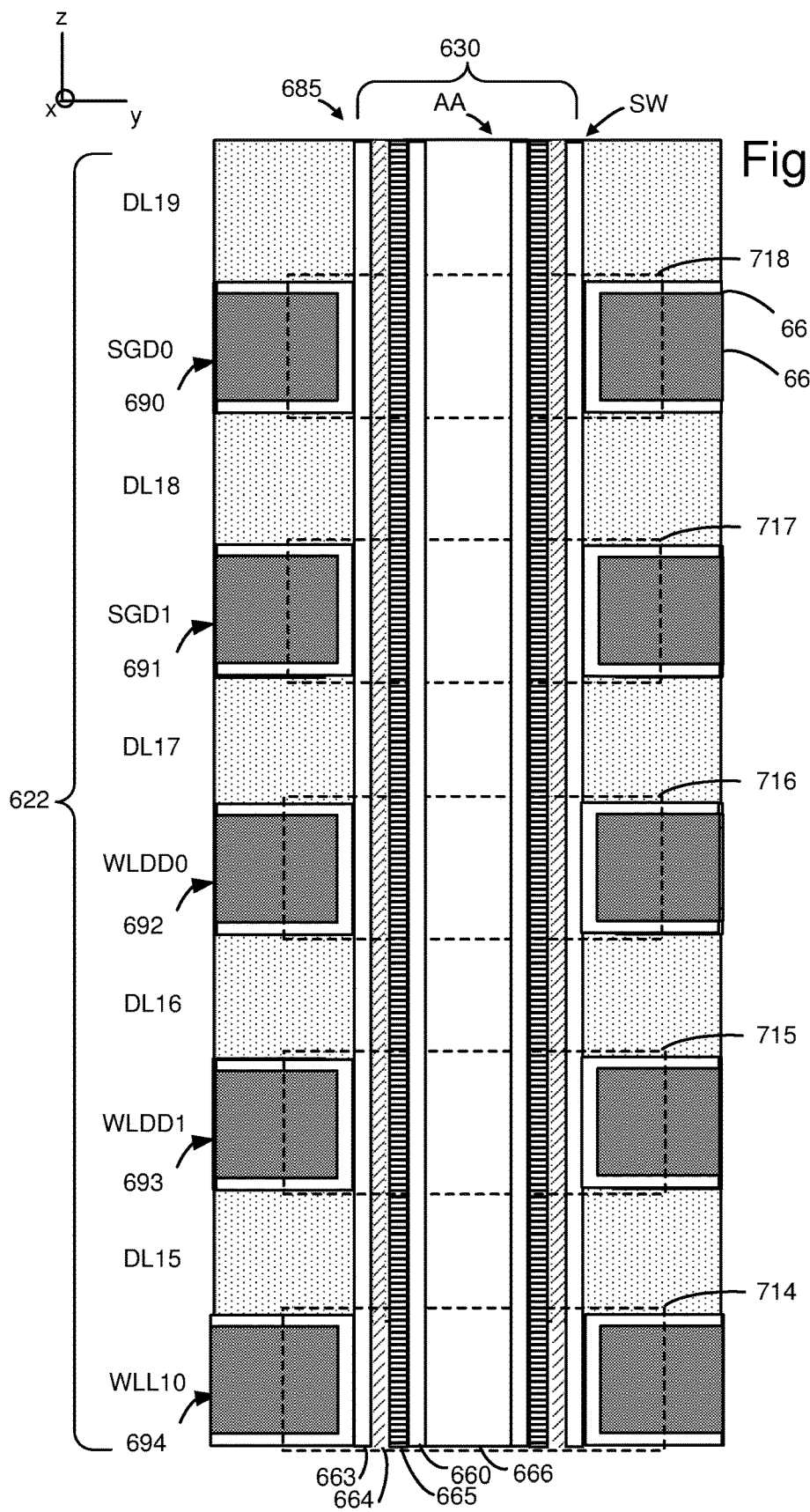

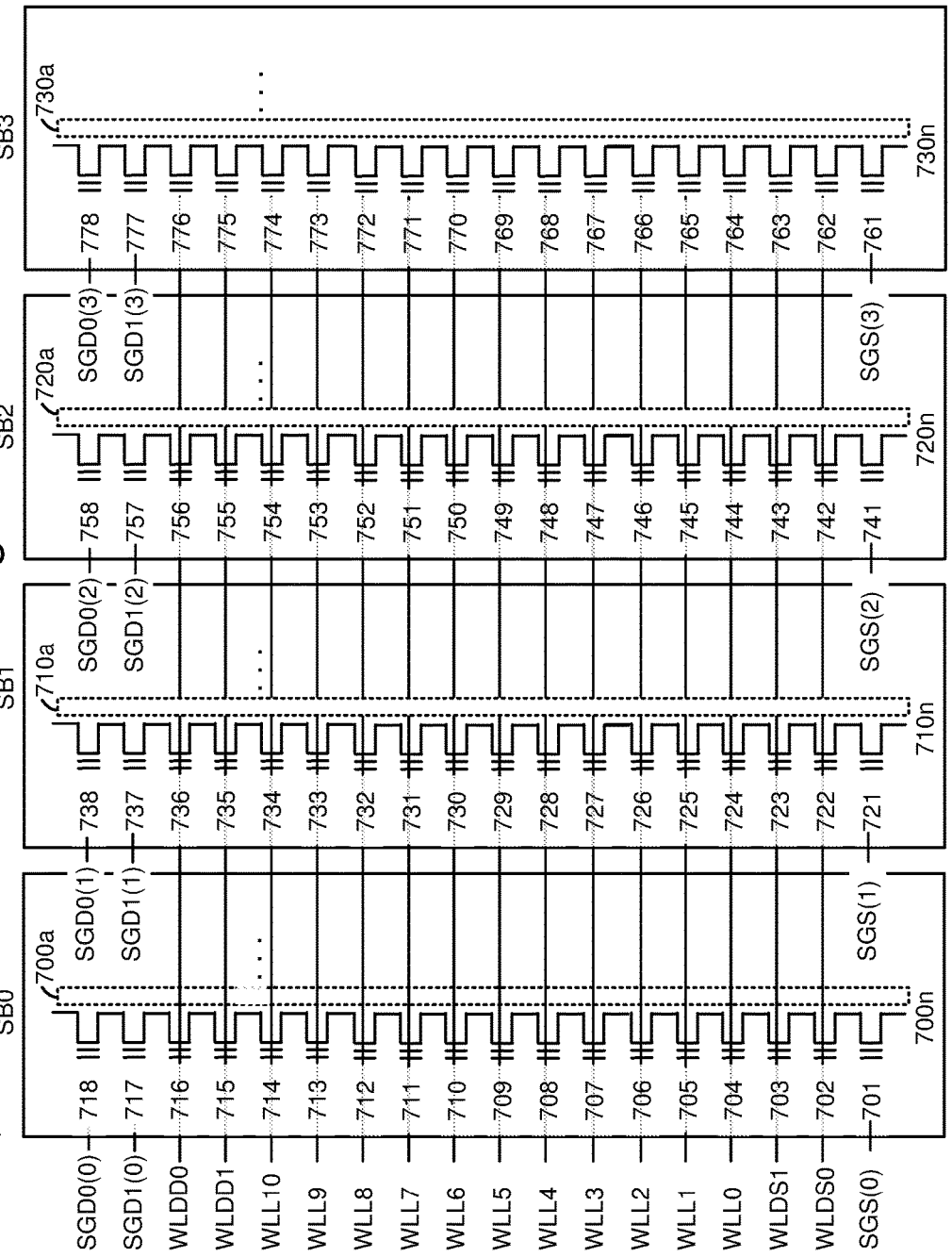

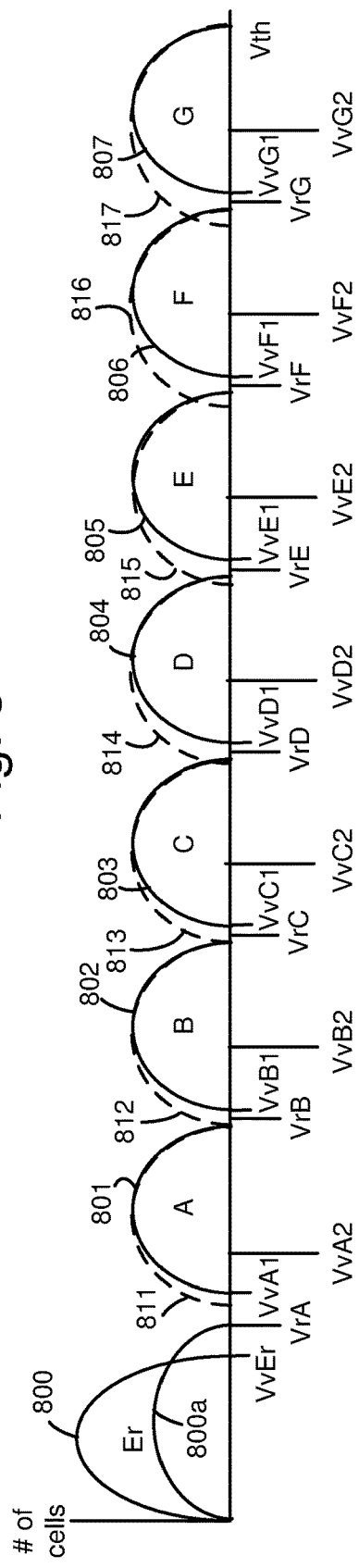

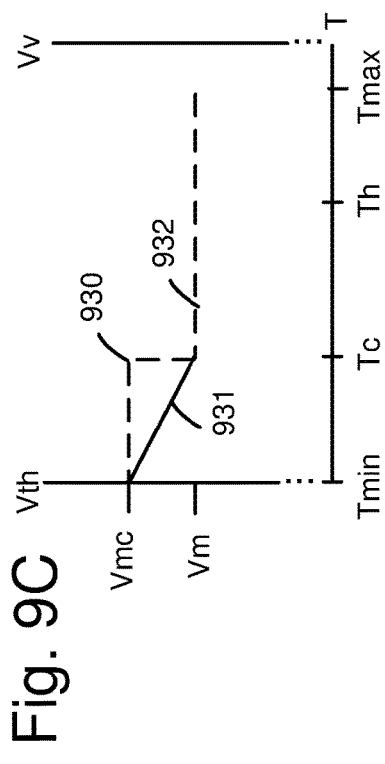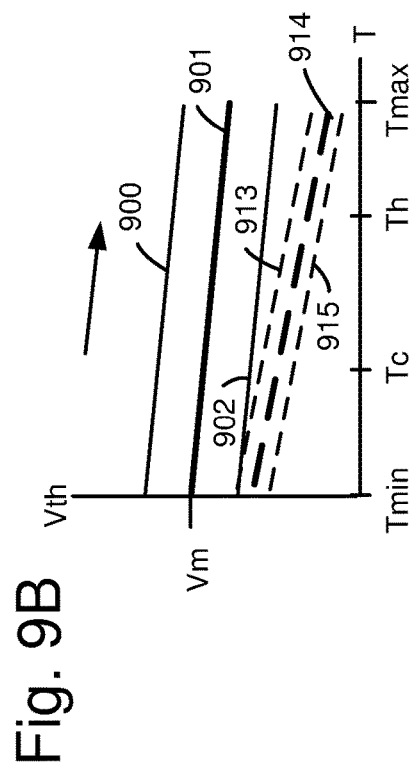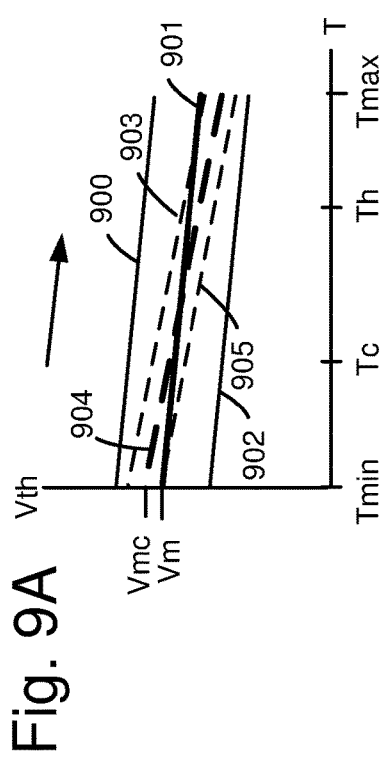

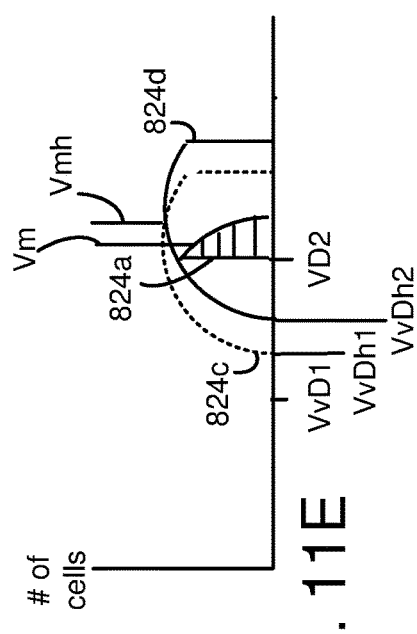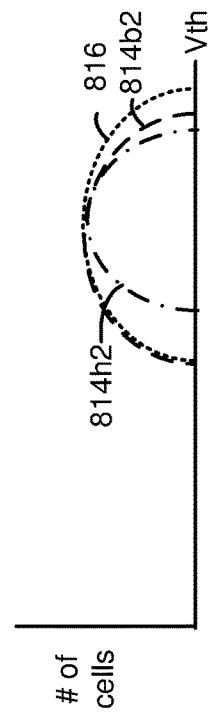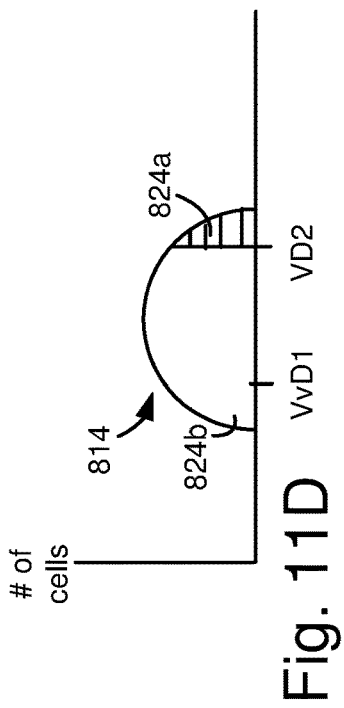
Fig. 11E
Fig. 11F
Fig. 11D

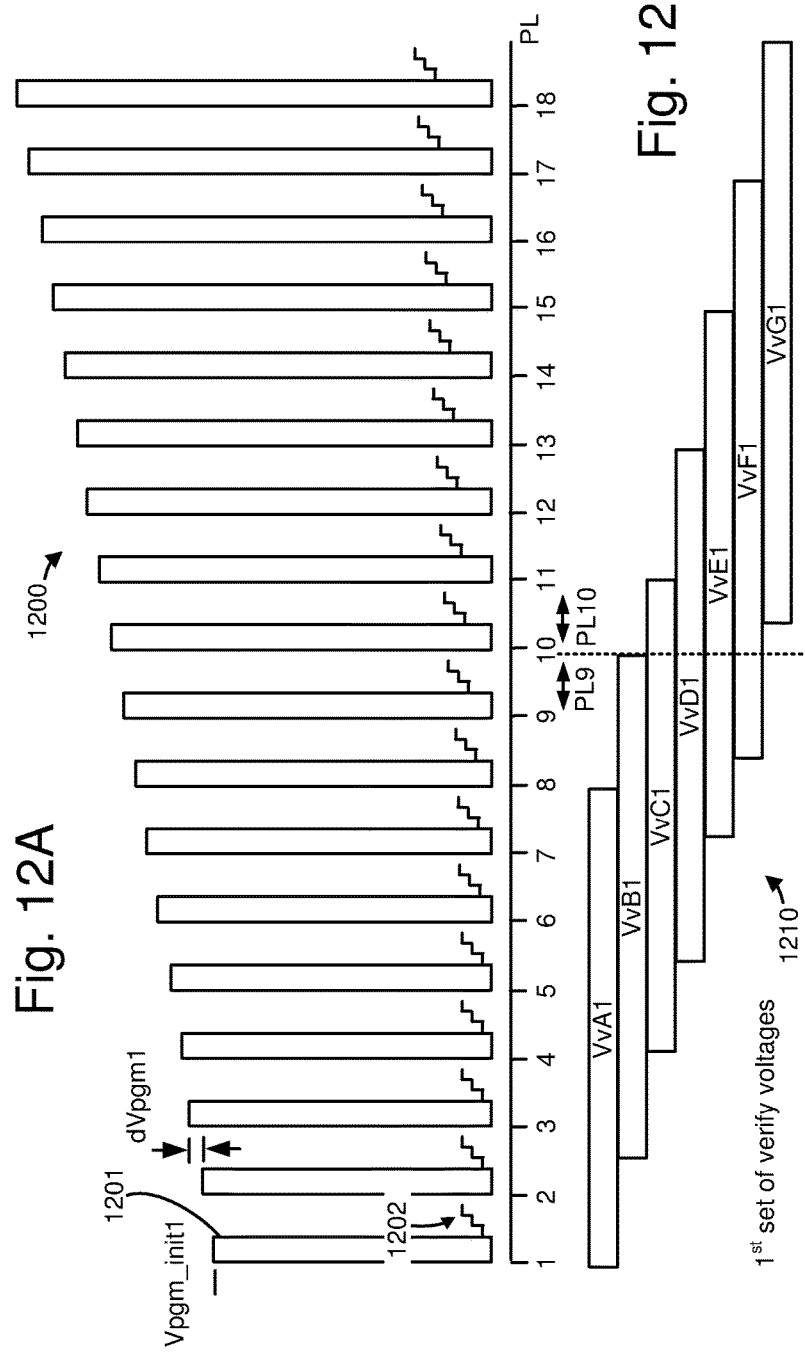

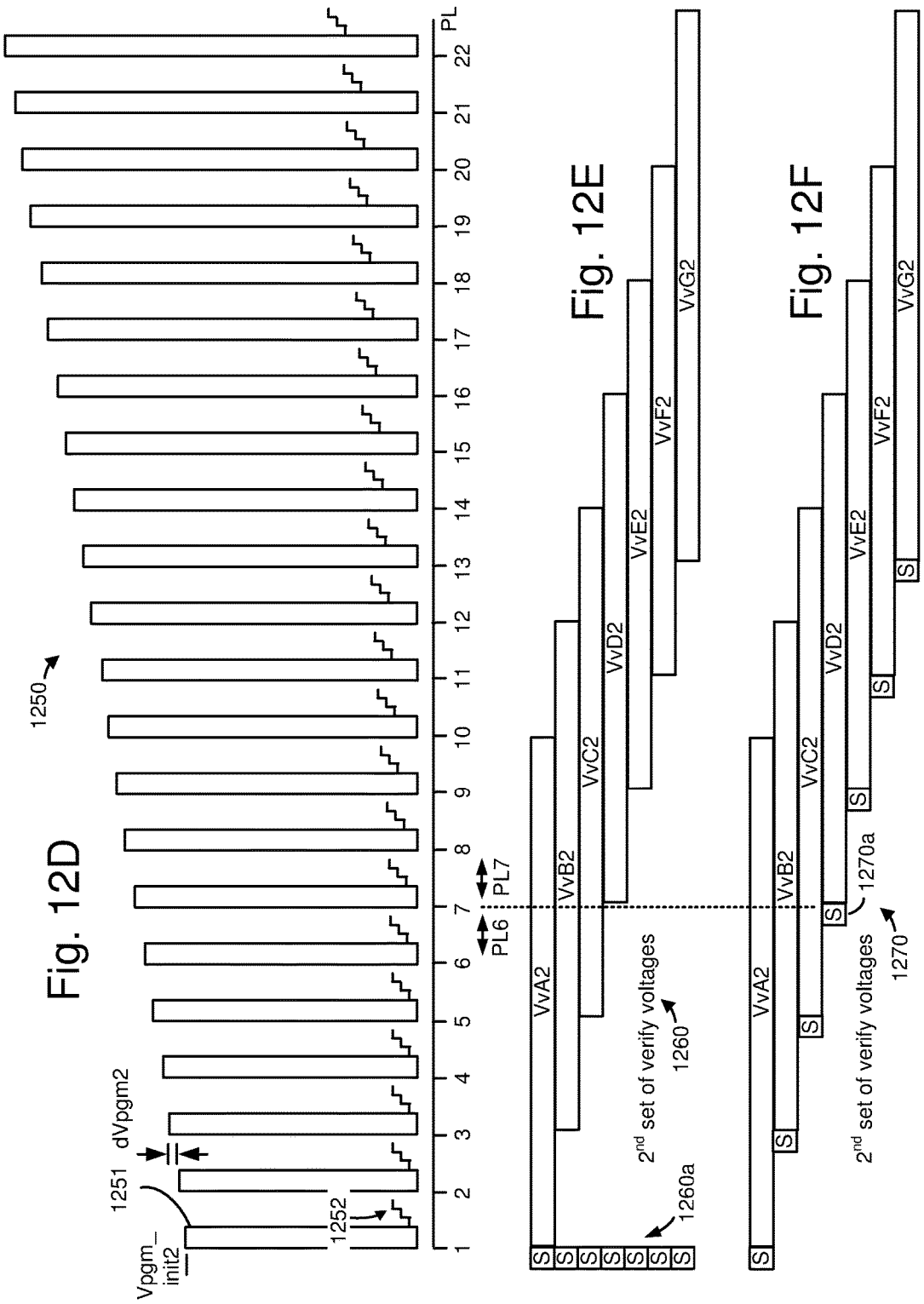

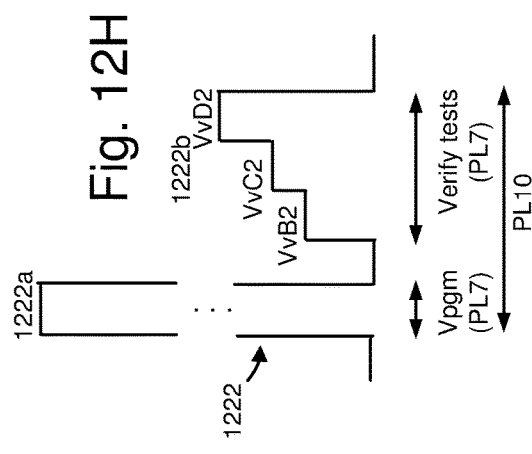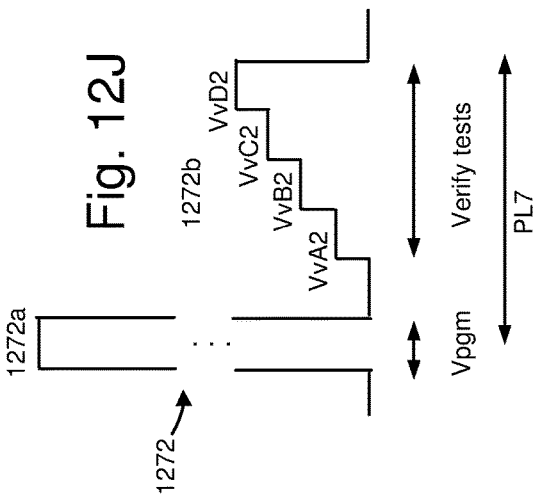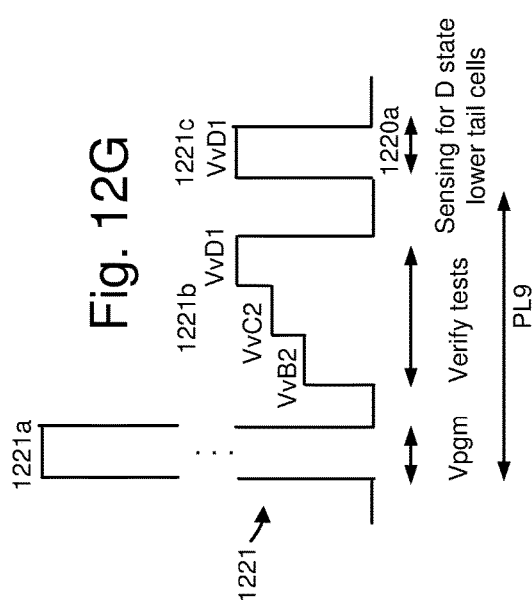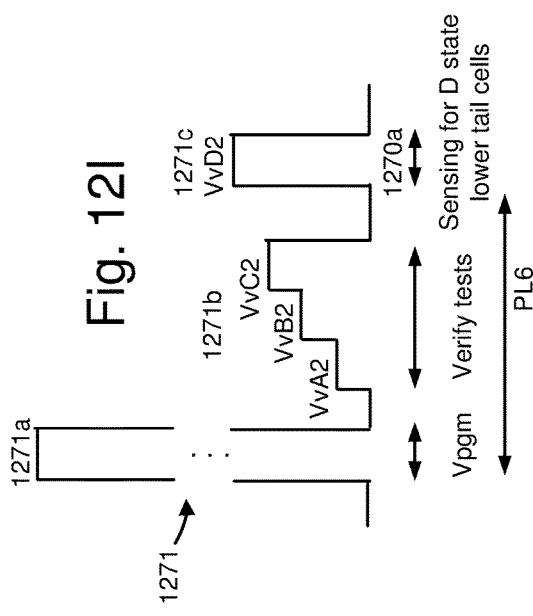

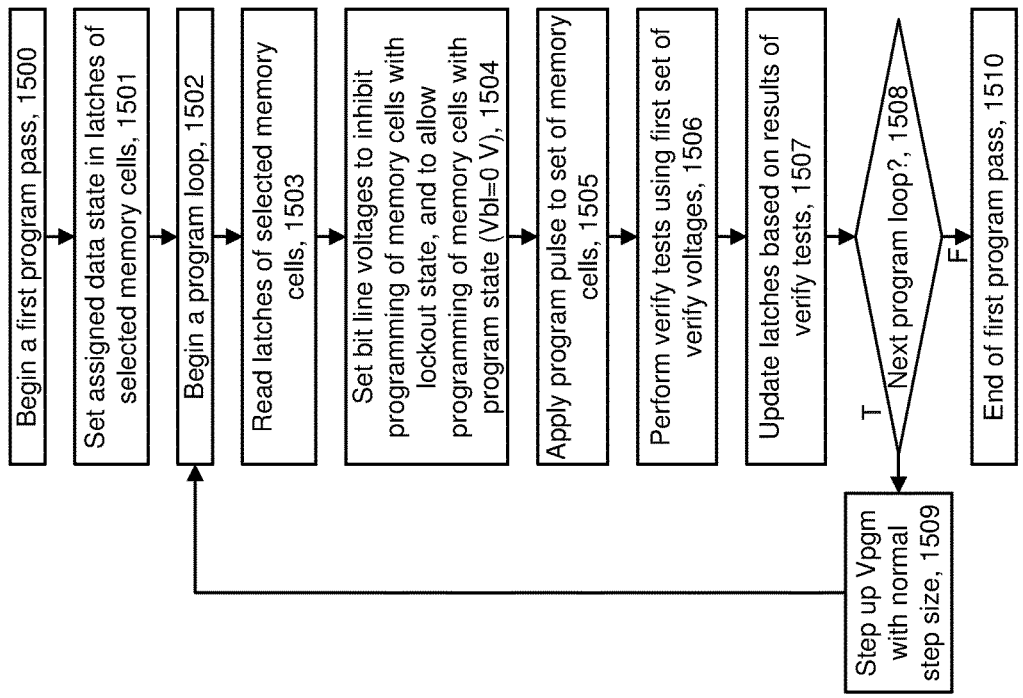
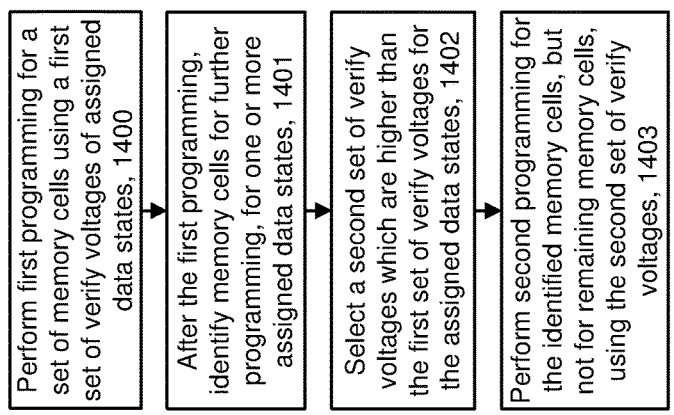

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

Fig. 17A

|    | Er | A | B | C | D | E | F | G |
|----|----|---|---|---|---|---|---|---|
| UP | 1  | 1 | 1 | 1 | 1 | 1 | 1 | 1 |
| MP | 1  | 1 | 1 | 1 | 1 | 1 | 1 | 1 |
| LP | 1  | 1 | 1 | 1 | 1 | 1 | 1 | 1 |

Fig. 17B

|    | Er | A | B | C | D | E | F | G |
|----|----|---|---|---|---|---|---|---|
| LO | 0  | 0 | 0 | 0 | 0 | 0 | 0 | 0 |
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

Fig. 18A

|    | Er | A | B | C | D | E | F | G |
|----|----|---|---|---|---|---|---|---|
| LO | 1  | 1 | 1 | 1 | 1 | 1 | 1 | 1 |
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

Fig. 18B

REDUCING WIDENING OF THRESHOLD VOLTAGE DISTRIBUTIONS IN A MEMORY DEVICE DUE TO TEMPERATURE CHANGE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 2 is a block diagram depicting one embodiment of the sense block 51 of FIG. 1.

FIG. 6B depicts a close-up view of the region 622 of the stack of FIG. 6A.

FIG. 7 depicts an example view of NAND strings in a block BLK0 which is consistent with FIGS. 4 and 6A.

FIG. 8 depicts example Vth distributions of a set of memory cells with and without charge loss.

FIG. 9A depicts a plot of Vth versus temperature (T), showing a decrease in Vth for high-Tco memory cells with temperature-based programming (dashed lines), and for normal Tco-memory cells without temperature-based programming (solid lines), when the high-Tco memory cells are programmed to a higher median Vth (Vmc) than a median Vth (Vm) of the normal-Tco memory cells at a low temperature.

FIG. 9B depicts a plot of Vth versus temperature (T), as a comparison to FIG. 9A, but where the high-Tco memory cells do not undergo temperature-based programming.

FIG. 9C depicts example plots of a median Vth as a function of temperature for high-Tco memory cells, consistent with FIG. 9A.

FIG. 11D depicts the D-state Vth distribution 814 of FIG. 8, including a portion 824a at an upper tail of the Vth distribution, having Vth>VD2, and a remaining portion 824b, having Vth<VD2.

FIG. 11E depicts Vth distributions 824c and 824d which are obtained by programming the remaining portion 824b of FIG. 11D using a verify voltage of VvDh1 or VvDh2, respectively.

FIG. 11F depicts an upshift in the D-state Vth distributions of FIG. 11E due to programming at a high temperature and reading at a low temperature.

FIG. 12A depicts a voltage signal in a program pass, such as a first program pass in a multi-pass program operation, or as the sole program pass of a one pass program operation.

FIG. 12B depicts an example of verify voltages used in different program loops, consistent with FIGS. 12A and 15A, where one set of verify voltages (one verify voltage per assigned data state) is used in a program pass.

FIG. 12C depicts an example of verify voltages used in different program loops, consistent with FIGS. 12A and 16, where first and second sets of verify voltages (two verify voltages per assigned data state) are used in a program pass, and the second sets of verify voltages are temperature-based.

FIG. 12D depicts a voltage signal in a program pass, such as a second program pass in a multi-pass program operation, which follows the voltage signal of FIG. 12A, consistent with FIG. 15C.

FIG. 12E depicts an example of verify voltages used in different program loops, consistent with FIG. 12A, where one set of temperature-based verify voltages (one verify voltage per assigned data state) is used in the second program pass for programming lower tail memory cells, and where the sensing of the lower tail memory cells occurs at a start of the second program pass.

FIG. 12F depicts the example verify voltages of FIG. 12E, where the sensing of the lower tail memory cells occurs just before a program loop, for each programmed data state.

FIG. 12G depicts an example voltage signal in program loop 9 (PL9) of FIG. 12C, consistent with the sense period 1220a.

FIG. 12H depicts an example voltage signal in program loop 10 (PL10) of FIG. 12C.

FIG. 12I depicts an example voltage signal in program loop 6 (PL6) of FIG. 12F, consistent with the sense period 1270a.

FIG. 12J depicts an example voltage signal in program loop 7 (PL7) of FIG. 12F.

FIG. 14 depicts an example program operation which minimizes Vth widening due to temperature changes.

FIG. 15A depicts an example of a first program pass in a multi-pass program operation, consistent with FIG. 14.

FIG. 17A depicts an example of bit values in latches at a start of a program pass, consistent with FIG. 14-16.

FIG. 17B depicts bit values in latches at a completion of a program operation, consistent with FIG. 17A.

FIG. 18A depicts an example of bit values in latches at a start of a first program pass, consistent with FIG. 14-16.

FIG. 18B depicts an example of bit values in latches at a completion of the program operation, consistent with FIG. 14-16.

DETAILED DESCRIPTION

Apparatuses and techniques are described for performing a program operation in a memory device, where the program operation reduces temperature-based changes in the threshold voltage distribution (Vth) of memory cells.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

Figure 10:
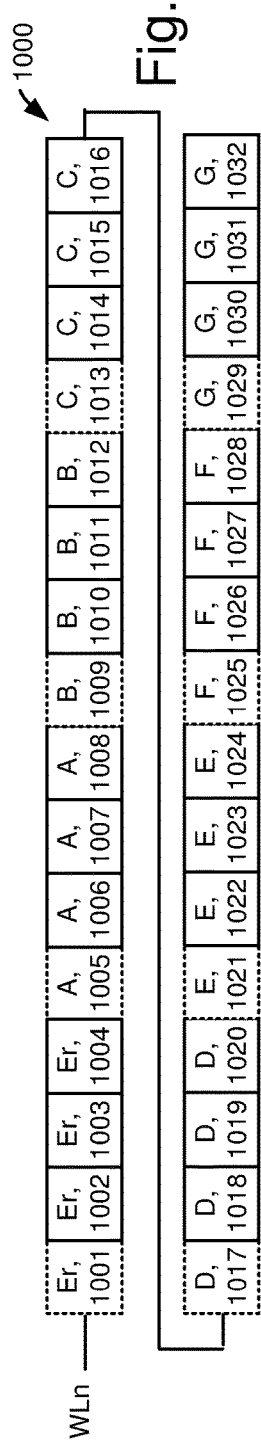
FIG. 10 depicts an example of a set of memory cells connected to a selected word line WLn, where some of the memory cells (dotted lines) have a high-Tco and remaining memory cells have a normal-Tco (solid lines).

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 10. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 8). In a four-bit per cell memory device, there are sixteen data states including the erased state and fifteen higher data states. The data states may be referred to as the S0-S15 data states where S0 is the erased state. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells.

However, the Vth of a memory cell can change due to temperature. The change in Vth with temperature can be expressed by a temperature coefficient, Tco, which is typically negative. For example, an increase in temperature will result in a decrease in Vth, and a decrease in temperature will result in an increase in Vth. An example Tco is −2 mV/C. The temperature at which the memory cells will be read after being programmed is typically unknown, so that large changes in temperature after programming can result in large changes in Vth. This, in turn, can cause read errors. The problem is particular severe for 3D memory devices and for multi-level memory cells with many data states such as 8 or 16 data states.

Techniques provided herein address the above and other issues. The techniques are based on an observation that different memory cells can have different values of Tco. For example, in a NAND string with a polysilicon channel, the density of grain boundary traps can vary within a NAND string and across different NAND strings. In particular, memory cells with a higher density of grain boundary traps tend to have a higher Tco magnitude. These variations may be due to non-uniformities in the fabrication process and tend to be randomly distributed. These memory cells also tend to have a larger short-term data retention loss, which is a measure of an amount of charge loss in a relatively short time period due to factors such as detrapping at the grain boundary traps.

A larger data retention loss in a given time period is associated with a faster charge loss. Detrapping can also occur at an oxide tunneling layer of a memory cell.

During a program operation, in some cases, the high-Tco memory cells tend to be at the lower tail of a Vth distribution of memory cells which are being programmed to a given assigned data state. The high-Tco memory cells may be at the lower tail because their charge loss occurs relatively soon after a verify test in a program loop. Thus, a high-Tco memory cell may pass a verify test, indicating its Vth is above a verify voltage, but the Vth may subsequently quickly decrease. The Vth of normal-Tco memory cells may decrease some time after the Vth decrease of the high-Tco memory cells. The normal-Tco memory cells may be considered to be remaining memory cells, other than the high-Tco memory cells, in a set of memory cells being programmed.

The techniques described herein leverage this knowledge to identify the high-Tco memory cells and program them based on the current temperature. For example, the high-Tco memory cells may be programmed to a relatively low or high level if the current temperature is relatively high or low, respectively. The case of programming at a low temperature and reading at a high temperature is particularly problematic, since this tend to lead to more Vth widening than the case of programming at a high temperature and reading at a low temperature. In one embodiment, the high-Tco memory cells undergo further programming compared to normal-Tco memory cells when it is relatively cold such that the temperature is below a specified level, and the high-Tco memory cells do not undergo further programming compared to normal-Tco memory cells when the temperature is above the specified level.

In one aspect, a program operation involves first and second passes. In the first pass, the memory cells are programmed using a first set of verify voltages which may be temperature-independent. In the second pass, the high-Tco memory cells are identified and programmed further using a second set of verify voltages which may be temperature-dependent. Further, the second pass is configured to provide a narrower Vth distribution width than a Vth distribution width of the first program pass. For example, the second pass may use a smaller program pulse step size and/or an elevated bit line voltage which slows down the programming of the high-Tco memory cells. The second set of verify voltages may be fixed, or they may be a function of temperature such as a decreasing function of temperature. That is, when the temperature is relatively low, the second set of verify voltages are relatively high and when the temperature is relatively high, the second set of verify voltages are relatively low. The second set of verify voltages are higher than the first set of verify voltages, for one or more assigned data states, for instance.

The high-Tco memory cells at the lower tail of the Vth distribution may be identified after the first pass by sensing the memory cells using the first set of verify voltages. In one example, the high-Tco memory cells are identified as memory cells which passed their respective verify test using the first set of verify voltages during the first pass, but subsequently experience detrapping and no longer pass the respective verify test.

In another aspect, the program operation involves one program pass, e.g., a single program pass. The program pass transitions from using a temperature-independent verify voltage to a using a temperature-dependent verify voltage, for one or more assigned data states. The transition may occur when the memory cells initially reach a lockout state using a first set of verify voltages, for instance.

In another aspect, the high-Tco memory cells are in the upper tail of a Vth distribution. In this case, the remaining memory cells can undergo further programming so that their Vth encompasses the Vth of the high-Tco memory cells.

These and other features are discussed further below.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 116 (power control circuit), a temperature-sensing circuit 117, and a verify voltage setting circuit 119. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 117 can detect a temperature of the memory device at the time of a program operation, for example, for use by the verify voltage setting circuit. The verify voltage setting circuit can set verify voltages for one or more assigned data states at a specified time in a one-pass or multi-pass program operation. See FIG. 1B for an example implementation of the temperature-sensing circuit and FIGS. 9C, 9G, 13A and 13B for an example implementation of how the verify voltage setting circuit can set verify voltages based on temperature. The temperature-sensing circuit and the verify voltage setting circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
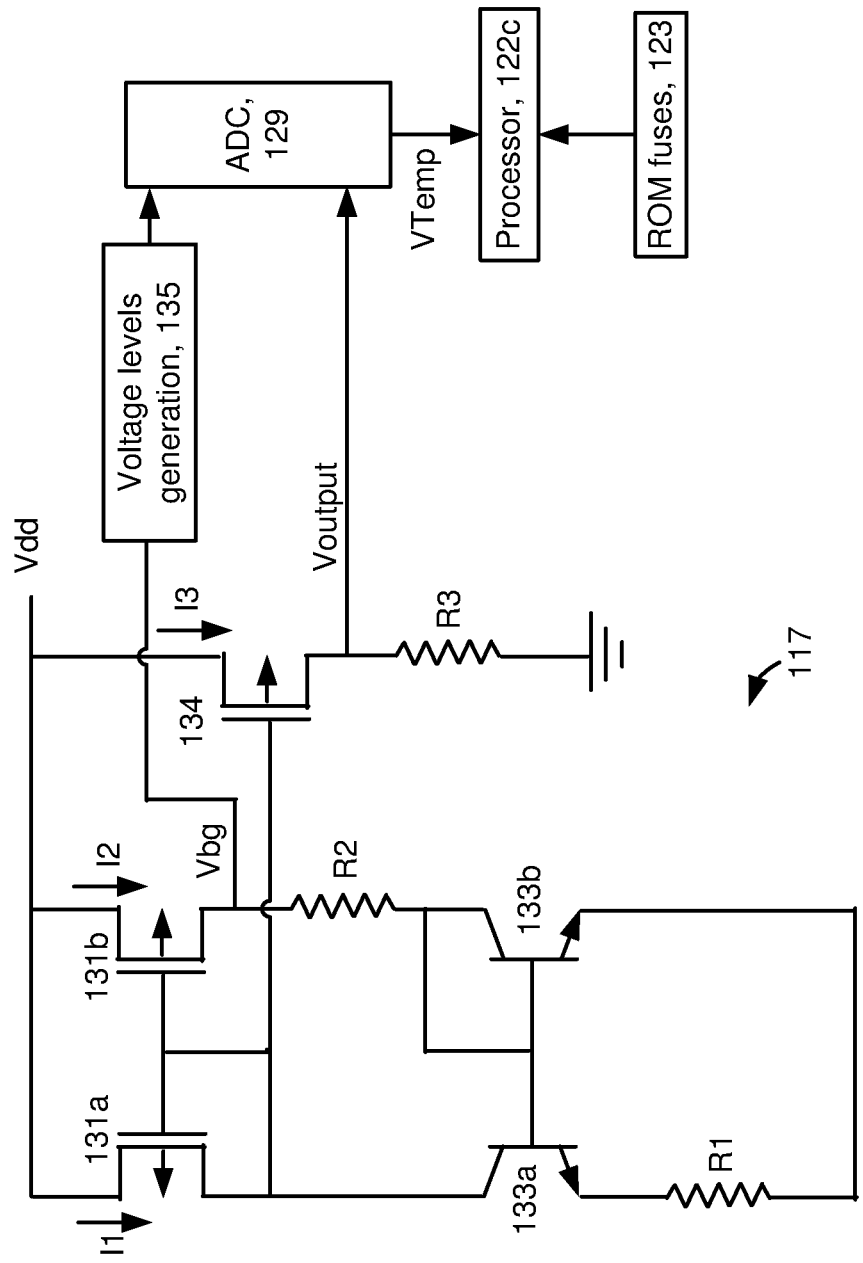
FIG. 1B depicts an example of the temperature-sensing circuit 117 of FIG. 1A.

FIG. 1B depicts an example of the temperature-sensing circuit 117 of FIG. 1A. The circuit includes pMOSFETs 131$a$, 131$b$ and 134, bipolar transistors 133$a$ and 133$b$ and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122$c$. This is data indicating a temperature of the memory device. ROM fuses 123 store data which correlates the matching voltage level to a temperature, in one approach. The processor then uses the temperature to set temperature-based parameters in the memory device such as by using the verify voltage setting circuit 119.

Vbg, is obtained by adding the base-emitter voltage (Vbe) across the transistor 131$b$ and the voltage drop across the resistor R2. The bipolar transistor 133$a$ has a larger area (by a factor N) than the transistor 133$b$. The PMOS transistors 131a and 131b are equal in size and are arranged in a current mirror configuration so that the current I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of the sense block 51 of FIG. 1. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., comprising individual latches LDL, MDL, UDL and LO, can be provided for each sense circuit. In some cases, additional data latches may be used. LDL stores a bit for a lower page of data, MDL stores a bit for a lower page of data, UDL stores a bit for an upper page of data and LO stores a bit indicated whether a memory cell is locked out. See also FIGS. 15A-16D and 17A-18B. This is in an eight-level or three-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per storage element implementation. An additional latch LO may be used, e.g., to identify lower tail memory cells which are to be programmed using temperature-dependent verify voltages.

The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
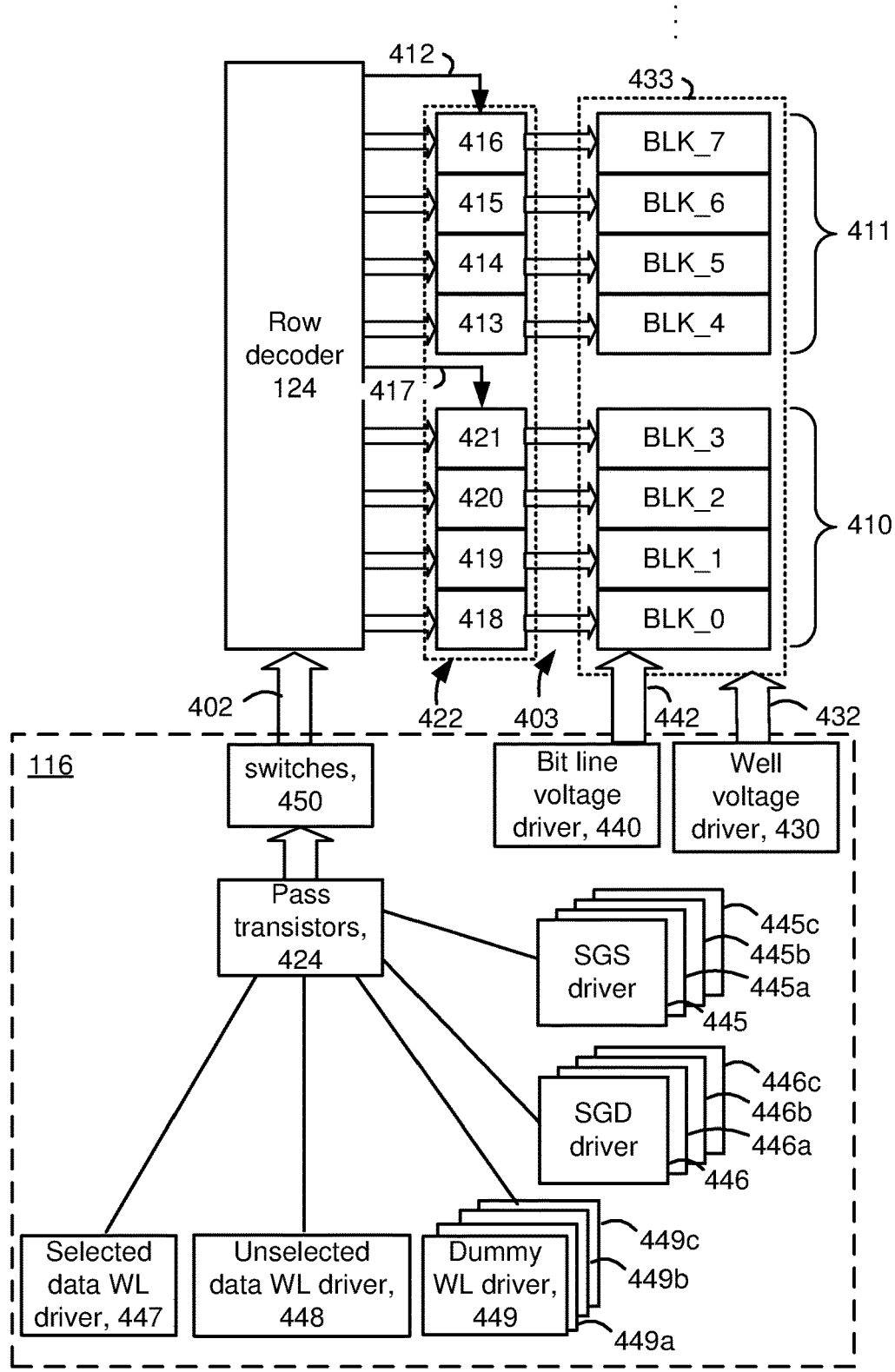
FIG. 3 depicts an example implementation of the power control module 116 of FIG. 1A for providing voltages to blocks of memory cells.

FIG. 3 depicts an example implementation of the power control module 116 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation, a driver 448 for unselected data word lines, and dummy word line drivers 449-449c which provide voltages on dummy word lines. For example, the dummy word line drivers 449, 449a, 449b and 449c may provide voltages on the control gate layers or word line layers WLDD0, WLDD1, WLDS1 and WLDS0, respectively, in FIG. 6A, during a refresh operation as described herein.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7, 8 and 11A. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vs1 to the well region 611a in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIG. 4 to 7, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
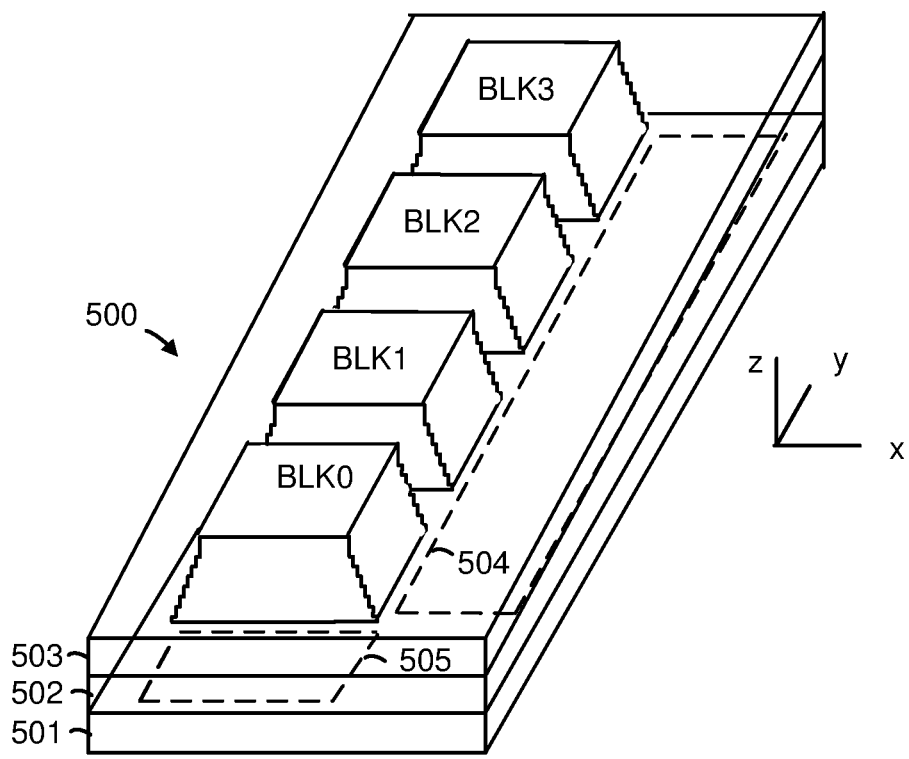
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
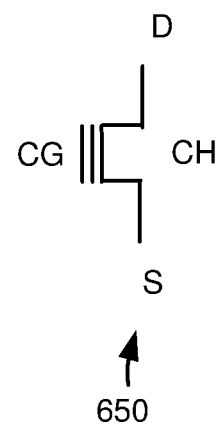
FIG. 5 depicts an example transistor 650.

FIG. 5 depicts an example transistor 650. The transistor comprises a control gate CG, a drain D, a source S and a channel CH and may represent a memory cell or a select gate transistor, for example.

Figure 6A:
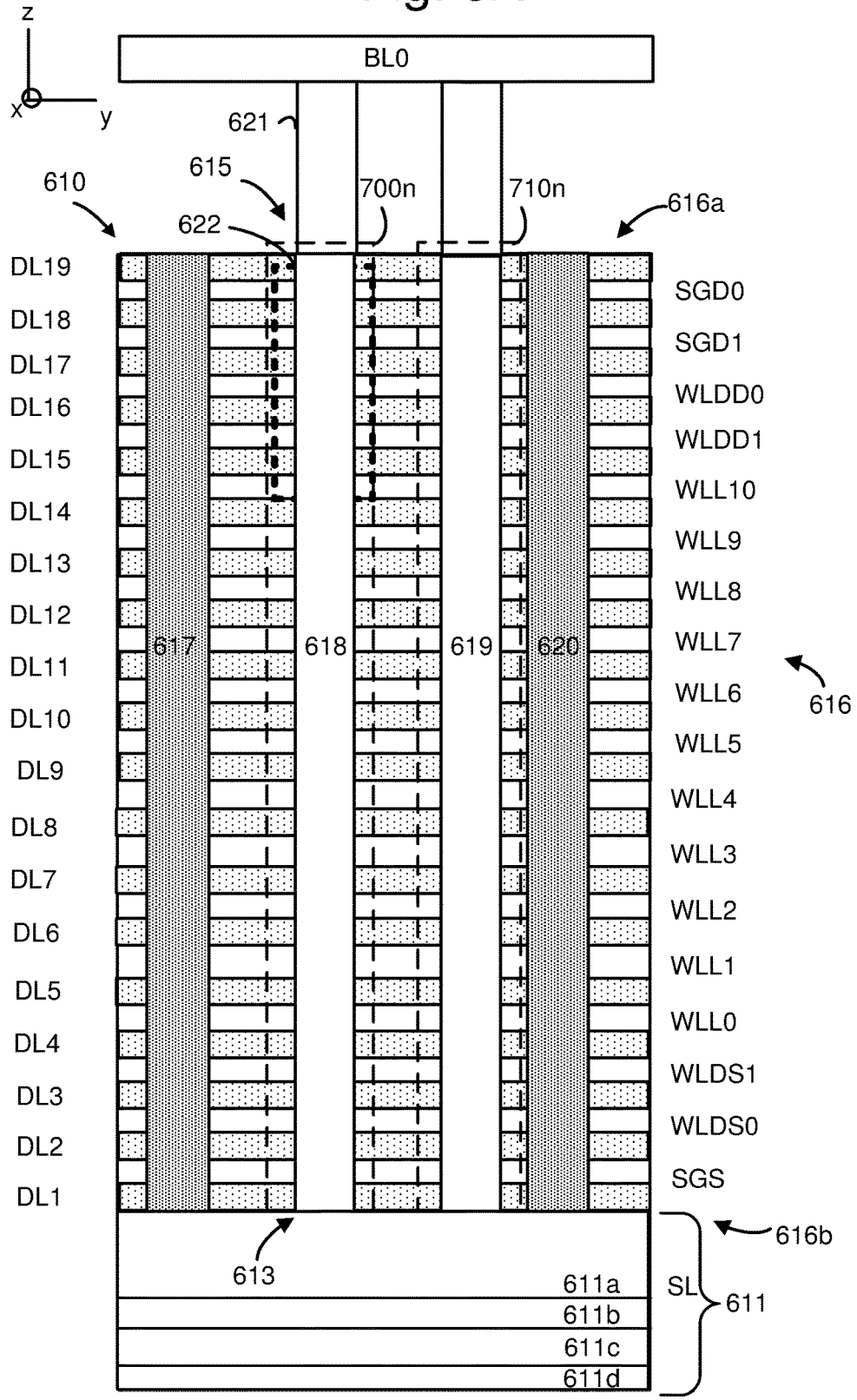
FIG. 6A depicts an example cross-sectional view of a portion of the block BLK0 of FIG. 4.

FIG. 6A depicts an example cross-sectional view of a portion of the block BLK0 of FIG. 4. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings 700n and 710n are depicted. Each NAND string encompasses a memory hole 618 or 619 which is filled with materials which form memory cells adjacent to the word lines. Region 622 of the stack is shown in greater detail in FIG. 6B.

The stack includes a substrate 611. In one approach, a portion of the source line SL comprises a well region 611a as an n-type source diffusion layer or well in the substrate. The well region is in contact with a source end of each string of memory cells in a block. An erase pulse may be applied to this layer in an erase operation The n-type well region 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NAND string 700n has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND string.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively. The channel 700a extends continuously in the NAND strings 700n from the SGS transistor 701 to the SGD transistors 717 and 718. The channel 700a is continuous in that it is uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line and end at WLL10, the drain-end word line, for example.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistor 741, dummy memory cells 742 and 743, data memory cells 744, 745, 746,

747, 748, 749, 750, 751, 752, 753 and 754, dummy memory cells 755 and 756, and SGD transistors 757 and 758.

NAND string 730*n* includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each NAND string, and one or more SGS transistors are provided at the source-end of each NAND string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by separate control lines SGS(0), SGS(1), SGS(2) and SGS(3), respectively. In another approach, all of the SGS transistors in a block are connected and commonly driven.

FIG. 8 depicts example Vth distributions of a set of memory cells with and without charge loss. The vertical axis depicts a number of memory cells on a logarithmic scale, and the horizontal axis depicts a Vth of the memory cells on a linear scale. In one approach, at a start of a program operation, the memory cells are all initially in the erased state as represented by the Vth distribution 800. After the program operation is successfully completed, the memory cells assigned to the Er state are represented by the Vth distribution 800*a*. The Vth distribution is upshifted due to program disturb.

The memory cells which are programmed to the A, B, C, D, E, F and G using verify voltages of VvA1, VvB1, VvC1, VvD1, VvE1, VvF1 and VvG1, respectively, are represented by the Vth distributions 801, 802, 803, 804, 805, 806 and 807, respectively. The "1" notation indicates that this is a first set of verify voltages. Each verify voltage in the first set of verify voltages is a first verify voltage for a respective data state. A second set of verify voltages VvA2, VvB2, VvC2, VvD2, VvE2, VvF2 and VvG2 is also depicted for reference. Each verify voltage in the second set of verify voltages is a second verify voltage for a respective data state. The second verify voltages may be used for further programming of a portion of a set of memory cells as described further below.

These Vth distributions are obtained just after completion of the program operation, and assume that no significant charge loss occurred. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage.

Due to charge loss, the Vth of the data memory cells can shift lower, as represented by the Vth distributions 811, 812, 813, 814, 815, 816 and 817 for the A, B, C, D, E, F and G states, respectively. The time at which the Vth downshift occurs after programming can vary. In some cases, the charge loss occurs relatively quickly after a verify pulse. These memory cells with a fast charge loss tend to be at the lower tail of a Vth distribution. The Vth downshift due to charge loss also tends to be greater for the higher data states.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied to the word lines.

The Er-G states are examples of assigned data states, and the A-G states are examples of programmed data states, in this eight state example. The number of data states could be higher or low than eight data states.

The example of FIG. 8 can be modified by further programming as described herein. In one embodiment, the further programming is for high-Tco memory cells which are at the lower tail of a Vth distribution of a data state. In another possible embodiment, the high-Tco memory cells are at the upper tail of a Vth distribution of a data state, and the further programming is for the remaining, normal-Tco memory cells.

FIG. 9A depicts a plot of Vth versus temperature (T), showing a decrease in Vth for high-Tco memory cells with temperature-based programming (dashed lines), and for normal Tco-memory cells without temperature-based programming (solid lines), when the high-Tco memory cells are programmed to a higher median Vth (Vmc) than a median Vth (Vm) of the normal-Tco memory cells at a low temperature.

The plot 901 represents a median threshold voltage distribution for the remaining memory cells, which are not subject to a temperature based adjustment in the verify voltage during programming, in one approach. The Vth distribution of these memory cells has a width (such as a three sigma width) extending from a lower bound denoted by the plot 902 to an upper bound denoted by a plot 900. The plot 904 represents a median Vth for the lower tail memory cells, which are subject to a temperature based adjustment in the verify voltage during programming. The Vth distribution of these memory cells has a narrower width compared to the remaining memory cells and is contained within the plots 903 and 905 as upper and lower bounds, respectively.

The temperature ranges from a minimum value, Tmin, such as −30° C. to a maximum value, Tmax, such as +85° C. Further, an example cold temperature, Tc, may be 0 C and an example hot temperature, Th, may be 40 C. A memory device is subject to varying temperatures based on the environment in which it is located. The slope of the plots is the Tco. As mentioned, Tco is typically negative such that Vth decreases as T increases. The slope magnitude of plot 904 for the high-Tco memory cells is greater than the slope magnitude of plot 901 for the normal-Tco memory cells.

In one example, assume that programming of a set of memory cells occurs at T=Tmin, e.g., a cold temperature. Further, the high-Tco memory cells are programmed to have a median Vth of Vmc and the normal-Tco memory cells are programmed to have a lower median Vth of Vm. Further, assume the memory cells are read later at Tmax, e.g., a hot temperature. Since the high-Tco cells have a larger magnitude Tco, their median Vth will decrease more than the decrease in the median Vth of the normal-Tco memory cells. However, the higher median Vth at the time of programming provides a sufficient margin so that the Vth width of the high-Tco memory cells remains within the Vth width of the remaining cells. In particular, the lower boundary (plot 905) of the Vth width of the high-Tco memory cells does not fall below the lower boundary (plot 902) of the Vth width of the remaining cells. As a result, the overall Vth width is not widened by the fact that the set of memory cells includes high-Tco memory cells. Essentially, the Vth width is reduced compared to the case where the high-Tco memory cells do not undergo temperature-based programming, as depicted in FIG. 9B. The rightward arrows in FIGS. 9A and 9B indicate that the temperature increases after programming.

FIG. 9B depicts a plot of Vth versus temperature (T), as a comparison to FIG. 9A, but where the high-Tco memory cells do not undergo temperature-based programming. The plot 914 represents a median Vth for the high-Tco memory cells. The Vth distribution of these memory cells is contained within upper and lower bounds represented by plots 913 and 915, respectively. The plots 901-903 are the same as in FIG. 9A. In this example, the Vth range of the high_Tco memory cells is below the Vth range of the remaining memory cells, so that the overall Vth width at Tmin is wider compared to FIG. 9A. The high-Tco memory cells are at the lower tail of the overall Vth distribution for a data state. As the temperature increases, the Vth range of high-Tco memory cells falls further below the Vth range of the normal-Tco memory cells. As a result, the overall Vth width increases further at Tmax. This is an undesired widening of the Vth distribution which can result in read errors.

FIG. 9C depicts example plots of a median Vth as a function of temperature for high-Tco memory cells, consistent with FIG. 9A. Generally, the median Vth of a set of memory cells with an assigned data state can be controlled by setting the verify voltage and other programming parameters such as program pulse magnitude and step size. In one embodiment, the median Vth of the lower tail memory cells can be set higher when programming at lower temperatures than when programming at higher temperatures, to avoid widening of the Vth distribution when reading occurs at higher temperatures.

The median Vth is depicted in a larger scale than that used in FIG. 9A to show more detail. One option for setting the median Vth is depicted by plots 930 and 932, which provide a step change in the median Vth at a specified temperature such as Tc. In this option, the median Vth is set to a relatively high level of Vmc when the temperature is relatively low, e.g., Tmin<T<Tc.

Another option involves a ramp change in the median Vth rather than a step change, as depicted by the plot 931. Plot 931 involves a ramp from Vmc to Vm when T changes from Tmin to Tc. A ramp change can provide a more precise setting of the Vth as a function of the temperature at the time of programming. Also, the amount of additional programming performed can be minimized. Other options are possible as well.

The right side vertical axis depicts a verify voltage which is proportional to the median Vth. For a given assigned data state, the median Vth and the verify voltage are a decreasing function of temperature. That is, when the temperature is relatively low, the median Vth and the verify voltage are relatively high and when the temperature is relatively high, the median Vth and the verify voltage are relatively low.

Another option is to adjust the magnitude of the decreasing function of the temperature to be relatively greater when a number of program-erase cycles of the set of memory cells is relatively greater. This approach provides an adjustment based on the fact that a larger number of P-E cycles is associated with a larger Vth downshift due to charge loss. Thus, Vmc can be relatively higher when the number of P-E cycles is relatively higher.

Figure 9D:
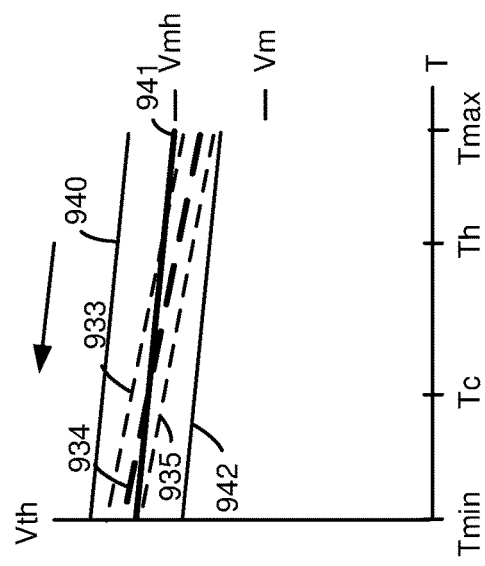
FIG. 9D depicts a plot of Vth versus temperature (T), showing an increase in Vth for high-Tco memory cells without temperature-based programming (dashed lines), and for normal Tco-memory cells without temperature-based programming (solid lines), where the memory cells are programmed at a high temperature.

FIG. 9D depicts a plot of Vth versus temperature (T), showing an increase in Vth for high-Tco memory cells without temperature-based programming (dashed lines), and for normal Tco-memory cells without temperature-based programming (solid lines), where the memory cells are programmed at a high temperature. This example is similar to FIG. 9A but represents the case of programming at Tmax and reading at Tmin. The plot 924 represents a median Vth for the high-Tco, lower-tail memory cells. The Vth distribution of these memory cells is contained within upper and lower bounds represented by plots 923 and 925, respectively. The plot 921 represents a median Vth for the remaining, normal-Tco memory cells. The Vth distribution of these memory cells is contained within upper and lower bounds represented by plots 920 and 922. Additionally, assume the normal-Tco memory cells are programmed to a median Vth of Vm at Tmax. Initially, the Vth range of the high-Tco memory cells is below the Vth range of the normal-Tco memory cells so that the overall Tco is relatively large. However, as the temperature decreases, the Vth range of the high-Tco memory cells merges with the Vth range of the normal-Tco memory cells so the overall Vth distribution width advantageously decreases. Accordingly, in some embodiments, further programming is not used when the temperature at the time of programming exceeds a specified temperature such as Th because the Vth range will not widen when a read occurs.

Figure 9F:
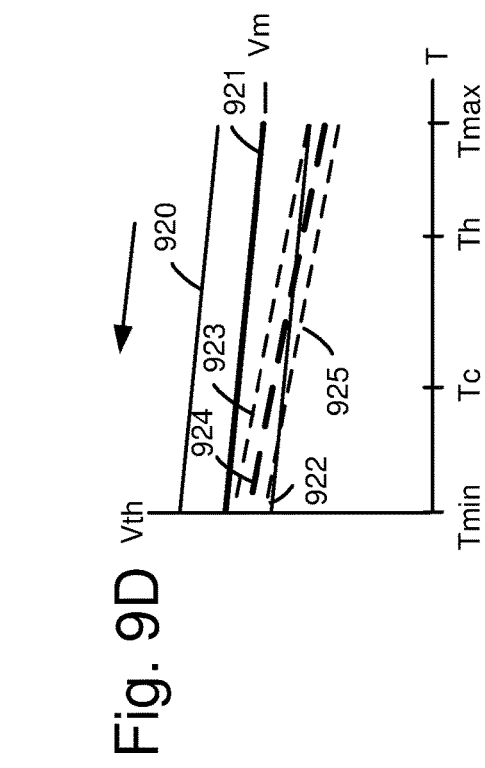
FIG. 9F depicts a plot of Vth versus temperature (T), as a comparison to FIG. 9E, but where the normal Tco-memory cells (solid lines) undergo temperature-based programming to encompass a Vth distribution of the high-Tco memory cells, which do not undergo temperature-based programming.
Figure 9E:
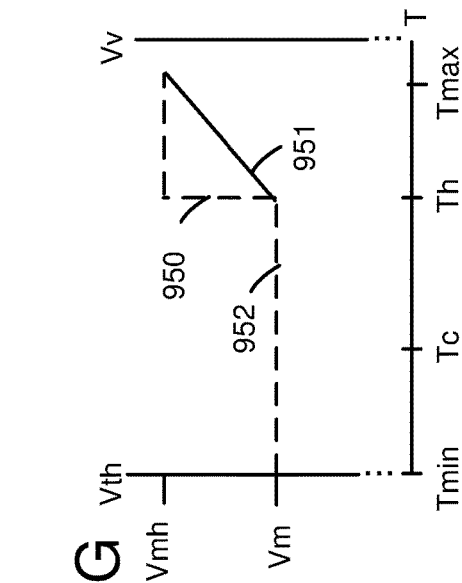
FIG. 9E depicts a plot of Vth versus temperature (T), showing an increase in Vth for high-Tco memory cells without temperature-based programming (dashed lines), and for normal Tco-memory cells without temperature-based programming (solid lines), where the memory cells are programmed at a high temperature, and where the high-Tco memory cells are at the upper tail of the overall Vth distribution.

The leftward arrows in FIG. 9D-9F indicate that the temperature decreases after programming. FIG. 9E depicts a plot of Vth versus temperature (T), showing an increase in Vth for high-Tco memory cells without temperature-based programming (dashed lines), and for normal Tco-memory cells without temperature-based programming (solid lines), where the memory cells are programmed at a high temperature, and where the high-Tco memory cells are at the upper tail of the overall Vth distribution. In some cases, the high-Tco memory cells could be at the upper tail of the overall Vth distribution of a set of memory cells being programmed rather than at the lower tail, as in the examples of FIGS. 9A, 9B and 9D.

The plot 934 represents a median Vth for the high-Tco, upper-tail memory cells. The Vth distribution of these memory cells is contained within upper and lower bounds represented by plots 933 and 935, respectively. The plot 920-922 are repeated from FIG. 9D. Additionally, assume the normal-Tco memory cells are programmed to a median Vth of Vm at Tmax. Initially, the Vth range of the high-Tco memory cells is above the Vth range for the normal-Tco memory cells. As the temperature decreases, the Vth range of the high-Tco memory cells increases further above the Vth range for the normal-Tco memory cells so that the overall Vth distribution becomes even wider. A solution to this issue is depicted in FIG. 9F.

FIG. 9F depicts a plot of Vth versus temperature (T), as a comparison to FIG. 9E, but where the normal Tco-memory cells (which have a Vth represents by the solid lines) undergo temperature-based programming to encompass a Vth distribution of the high-Tco memory cells (which have a Vth represents by the dashed lines), which do not undergo temperature-based programming.

The plots 933-935 are the same as in FIG. 9E. Additionally, the plot 941 represents a median Vth for the remaining, normal-Tco memory cells. The Vth distribution of these memory cells is contained within upper and lower bounds represented by plots 940 and 942. The normal-Tco memory cells are initially programmed to a median Vth (Vm), as in FIG. 9E, and then further programmed to a higher median Vth of Vmh. As a result, the Vth range of the normal-Tco is shifted higher to encompass the high-Tco, upper tail memory cells. Subsequently, as the temperature decreases, the Vth range of the high-Tco memory cells remains within the Vth range for the normal-Tco memory cells so that the overall Vth distribution advantageously remains relatively narrow. Note that read voltages can be optimized based on the Vth range of the set of memory cells being programmed. For example, a read voltage can be shifted higher as the overall Vth distribution is shifted higher.

In another possible solution to the problem depicted in FIG. 9E, the high-Tco, upper tail memory cells could be erased to move the Vth into the range of the normal-Tco memory cells.

Figure 9G:
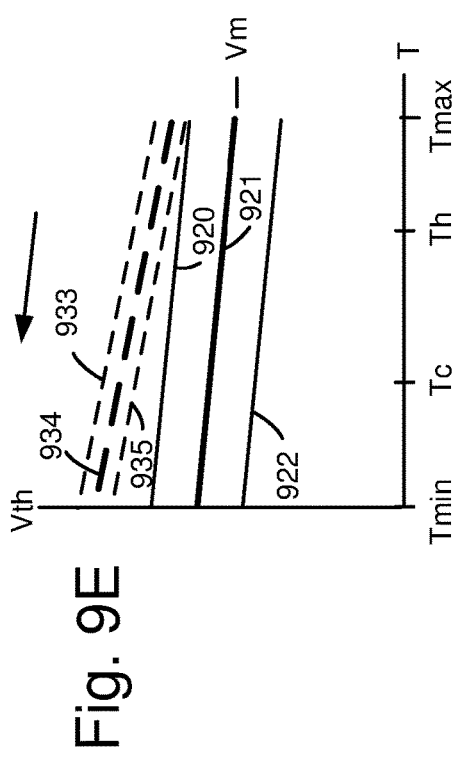
FIG. 9G depicts example plots of a median Vth as a function of temperature for normal-Tco memory cell, consistent with FIG. 9F.

FIG. 9G depicts example plots of a median Vth as a function of temperature for normal-Tco memory cell, consistent with FIG. 9F. The median Vth of the normal-Tco memory cells in a set of memory cells can be set higher when programming at higher temperatures than when programming at lower temperatures, to avoid widening of the Vth distribution when reading occurs at lower temperatures.

The median Vth is depicted in a larger scale than that used in FIG. 9F to show more detail. One option for setting the median Vth is depicted by plots 950 and 952, which provide a step change in the median Vth at a specified temperature such as Th. In this option, the median Vth is set to a relatively high level of Vmh when the temperature is relatively high, e.g., Tmax>T>Th.

Another option involves a ramp change in the median Vth rather than a step change, as depicted by the plot 951. Plot 951 involves a ramp from Vmh to Vm when T changes from Tmax to Th.

The right side vertical axis depicts a verify voltage which is proportional to the median Vth. For a given assigned data state, the median Vth and the verify voltage are an increasing function of temperature. That is, when the temperature is relatively low, the median Vth and the verify voltage are relatively low and when the temperature is relatively high, the median Vth and the verify voltage are relatively high.

Another option is to adjust the magnitude of the increasing function of the temperature to be relatively greater when a number of program-erase cycles of the set of memory cells is relatively greater. Thus, Vmh can be relatively higher when the number of P-E cycles is relatively higher.

The examples of FIG. 9A-9G involve one assigned data state as an example. The Vth range will vary for the different assigned data states. Further, the examples involved programming and reading at the extreme temperatures of Tmin and Tmax. A more typical example might involve reading at intermediate temperatures between Tc and Th.

Also, in FIGS. 9A, 9B and 9D-9F, the differences in the Tco slopes is emphasized for clarity. In practice, the difference in Tco between the high-Tco memory cells may be smaller than what is depicted.

In some embodiments, further programming of high-Tco memory cells is not used when the programming occurs during intermediate temperatures because the amount of widening of the Vth range is limited compared to the case of programming at a cold or hot temperature, e.g., below Tc or above Th, respectively.

FIG. 10 depicts an example of memory cells connected to a selected word line WLn, where some of the memory cells (dotted lines) have a high-Tco and remaining memory cells have a normal-Tco (solid lines). As mentioned, some portion of the memory cells in a set of memory cells which is being programmed will have a relatively high-Tco, and these memory cells can typically be identified based on their Vth being in the lower tail of the Vth distribution of the set of memory cells, in some embodiments. In this simplified example, the set of memory cells 1000 includes 32 memory cells which are connected to a selected word line, WLn. For simplicity, the assigned data states are arranged one after the other in a series although, in practice, the assigned data states are usually randomly distributed among a set of memory cells. Additionally, one in four memory cells is considered to be a high-Tco memory cell. The set of memory cells 1000 includes Er-state memory cells 1001-1004, A-state memory cells 1005-1008, B-state memory cells 1009-1012, C-state memory cells 1013-1016, D-state memory cells 1017-1020, E-state memory cells 1021-1024, F-state memory cells 1025-1028 and G-state memory cells 1029-1032.

The high-Tco memory cells (shown by boxes with dotted lines) are the memory cells 1001, 1005, 1009, 1013, 1017, 1021, 1025 and 1029. The normal-Tco memory cells, or remaining memory cells in the set of memory cells (shown by boxes with solid lines) are the memory cells 1002-1004, 1006-1008, 1010-1012, 1014-1016, 1018-1020, 1022-1024, 1026-1028 and 1030-1032.

The set of memory cells 1000 represents all of the memory cells involved in a program operation. A set of memory cells could also refer to memory cells of a particular assigned data state.

Figure 11B:
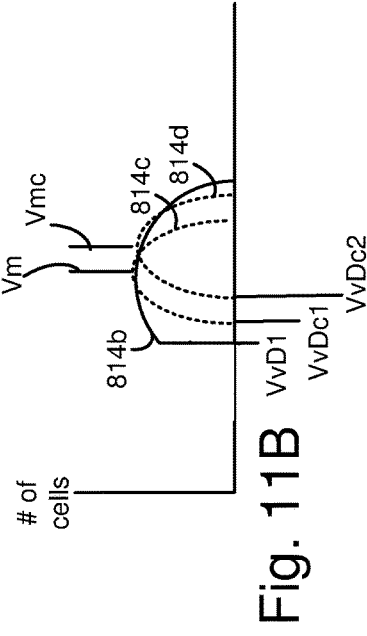
FIG. 11B depicts Vth distributions 814c and 814d which are obtained by programming of the lower tail memory cells of FIG. 11A using a verify voltage of VvDc1 or VvDc2, respectively.
Figure 11C:
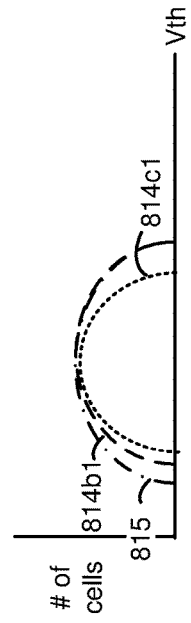
FIG. 11C depicts a downshift in the D-state Vth distribution of FIG. 11B due to programming at a low temperature and reading at a high temperature.
Figure 11A:
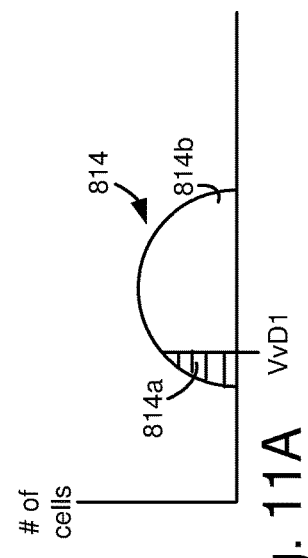
FIG. 11A depicts the D-state Vth distribution 814 of FIG. 8, including a portion 814a at a lower tail of the Vth distribution, having Vth<VvD1, and a remaining portion 814b, having Vth>VvD1.

FIG. 11A depicts the D-state Vth distribution 814 of FIG. 8, including a portion 814a at a lower tail of the Vth distribution, having Vth<VvD1, and a remaining portion 814b, having Vth>VvD1. The portion 814a represents one portion of a set of memory cells, such as the high-Tco memory cells in the set (e.g., memory cells 1001, 1005, 1009, 1013, 1017, 1021, 1025 and 1029 in the set 1000 of FIG. 10). The remaining portion 814b represents a remaining portion of a set of memory cells, such as the normal-Tco memory cells in the set (e.g., memory cells 1002-1004, 1006-1008, 1010-1012, 1014-1016, 1018-1020, 1022-1024, 1026-1028 and 1030-1032 in the set 1000 of FIG. 10).

The D-state Vth distribution is shown as an example, and the principles discussed can apply to other data states as well. Among the memory cells assigned to the D state, the memory cells in the portion 814a are the lower tail or high-Tco memory cells and the memory cells in the remaining portion 814b are the remaining or normal-Tco memory cells, in one embodiment. One option is to sense the memory cells using the verify voltage VvD1, which is the normal D-state verify voltage, to identify the lower tail memory cells. Another option is to sense the memory cells using another verify voltage (other than VvD1). During the sensing, the lower tail memory cells will be conductive and the remaining memory cells will be non-conductive. The lower tail memory cells can be considered to be those memory cells with a Vth in the lower 1-30% of a set of memory cells of a given assigned data state, for example.

In one embodiment, for a given data state, the lower tail memory cells are detected after the memory cells assigned to the data state have reached the lockout state. Thus, the lower tail memory cells will be those which experience a Vth downshift after reaching lockout. The lower tail memory cells are not necessarily slow programming memory cells, but can have different program speeds. Further, these lower tail memory cells will be high-Tco memory cells which have relatively fast detrapping, e.g., a relatively large short-term data retention loss compared to the remaining memory cells. The lower tail memory cells may detrap right after the verify test finishes. These cells tend to have more grain boundary traps, which explains why they have larger Tco.

In one option, discussed further below such as in FIG. 15A-15C, the memory cells are sensed after a program pass to identify the lower tail memory cells. The lower tail memory cells but not the remaining memory cells are then subject to further programming in another program pass using temperature-based verify voltages. In another option, discussed further below such as in FIG. 16, the memory cells are programmed in one program pass, where the programming includes a first number of program loops in which the memory cells of an assigned data state reach a lockout state using a temperature-independent verify voltage. A sensing operation is then performed to identify the lower tail memory cells, and a second number of program loops is performed in which the lower tail memory cells are further programmed and again reach the lockout state using a temperature-dependent verify voltage. Further, the second number of program loops may provide a slower programming of the lower tail memory cells (compared to the programming speed in the first number of program loops) to achieve a narrower Vth distribution of the lower tail memory cells (compared to the Vth distribution width for the remaining memory cells), as discussed. The normal speed and slow speed programming can be provided separately for each of the different data states.

FIG. 11B depicts Vth distributions 814c and 814d which are obtained by programming of the lower tail memory cells of FIG. 11A using a verify voltage of VvDc1 or VvDc2, respectively.

After the programming, the median Vth of the lower tail memory cells (Vmc) may be above the median Vth of the remaining memory cells (Vm). VvDc1 or VvDc2 can be a decreasing function of temperature such that VvDc1 or VvDc2 is relatively high when temperature is relatively low. In another approach, the median Vth of the lower tail memory cells is aligned with the median Vth of the remaining memory cells. VvDc1 or VvDc2 could be independent of the current temperature in this approach. VvDc1 and VvDc2 are both greater than VvD1.

The Vth distribution portion 814b is shown as being cutoff at the lower tail but will generally have a Gaussian shape as detrapping occurs continuously, including after programming.

The Vth distribution of the lower tail memory cells should not be higher than the Vth distribution of the remaining memory cells or this can cause widening at the upper tail of the overall Vth distribution.

In the case of programming at a high temperature, it is possible to omit the option to identify and further program the lower tail memory cells. Although, one advantage of the further programming of the lower tail memory cells is to narrow the overall Vth distribution width.

FIG. 11C depicts a downshift in the D-state Vth distribution of FIG. 11B due to programming at a low temperature and reading at a high temperature. As mentioned, programming at a low temperature and reading at a high temperature results in a Vth downshift due to Tco. Moreover, the Vth distribution is also widened since the lower tail cells (which have faster detrapping) tend to have larger magnitude Tco. In particular, the Vth distribution portion 814b transitions to the Vth distribution portion 814b1, the Vth distribution portion 814c transitions to the Vth distribution portion 814c1. An additional Vth distribution 815 represents a comparison case which would occur if the low tail memory cells were not programmed to the Vth distribution portion 814c in FIG. 11B. This comparison case has additional undesirable Vth widening at the lower tail.

FIG. 11D depicts the D-state Vth distribution 814 of FIG. 8, including a portion 824a at an upper tail of the Vth distribution, having Vth>VD2, and a remaining portion 824b, having Vth<VD2. This example is relevant to a scenario in which memory cells with a Vth in the upper tail of a Vth distribution of a set of memory cells have a higher magnitude Tco than remaining memory cells in the set of memory cells, as mentioned, e.g., in connection with FIG. 9E-9G. VD2 is not a verify voltage in this example, but identifies the lower bound of the upper tail. The upper tail memory cells can be considered to be those memory cells with a Vth in the upper 1-30% of a set of memory cells of a given assigned data state, for example.

The portion 824a represents one portion of a set of memory cells, such as the high-Tco memory cells in the set (e.g., memory cells 1001, 1005, 1009, 1013, 1017, 1021, 1025 and 1029 in the set 1000 of FIG. 10). The portion 824b represents memory cells, such as the normal-Tco memory cells in the set (e.g., memory cells 1002-1004, 1006-1008, 1010-1012, 1014-1016, 1018-1020, 1022-1024, 1026-1028 and 1030-1032 in the set 1000 of FIG. 10).

The memory cells of the portion 824b may comprise more than half, e.g., more than 70% of the set of memory cells. The memory cells of this portion are a subset of the set of memory cells which has a threshold voltage below a specified level (VD2). The subset of the set of memory cells may comprises more than half of the set of memory cells. The portion 824a is a remaining portion of the set of memory cells, which has a threshold voltage above the specified level.

FIG. 1E depicts Vth distributions 824c and 824d which are obtained by programming the remaining portion 824b of FIG. 11D using a verify voltage of VvDh1 or VvDh2, respectively. The memory cells of the portion 824a are not further programmed. Instead, the memory cells of the remaining portion 824b are programmed using one or more program loops. This approach is opposite to the vase of the high-Tco memory cells being at the lower tail, where the high-Tco memory cells undergo further programming.

The program loops can include a verify test which uses a lower verify voltage VvDh1 to achieve a median Vth of Vm for both the Vth distributions 824a and 824c. Or, a higher verify voltage VvDh2 can be used to achieve a higher median Vth of Vmh>Vm for the Vth distribution 824d. VvDh1 and VvDh2 are both greater than VvD1.

FIG. 11F depicts an upshift in the D-state Vth distributions of FIG. 11E due to programming at a high temperature and reading at a low temperature. As mentioned, programming at a high temperature and reading at a low temperature results in a Vth upshift due to Tco. Moreover, the Vth distribution may also be widened such as in the case of high-Tco memory cells at the upper tail of a Vth distribution. In particular, the Vth distribution portion 824c transitions to the Vth distribution portion 814b2, and the Vth distribution portion 824a transitions to the Vth distribution portion 814h2. An additional Vth distribution 816 represents a comparison case which would occur if the programming of FIG. 11E is not used. This comparison case has additional undesirable Vth widening at the upper tail.

FIG. 12A depicts a voltage signal in a program pass, such as a first program pass in a multi-pass program operation, or as the sole program pass of a one pass program operation. The horizontal axis denotes a program loop number, ranging from 1-18, and the vertical axis denotes voltage. During a program operation, program loops are performed for a selected word line in a selected block. A program loop comprises a program portion in which a program voltage or pulse is applied to the selected word line followed by a verify portion in which a verify signal or pulse is applied to the selected word line while one or more verify tests, referred to as program-verify tests, are performed for the associated memory cells. Other than the erased state, each assigned state has a verify voltage which is used in the verify test for the state in a program operation.

The voltage signal 1200 includes a series of program voltages, including an initial program voltage 1201, which are applied to a word line selected for programming. In this example, the voltage signal includes program voltages which increase stepwise in amplitude in one or more program loops of a programming pass using a fixed or varying step size. This is referred to as incremental step pulse programming, where the program voltage (Vpgm) starts at an initial level, Vpgm_init1, and increases in a step in each successive program loop, for instance, until the program operation is completed. A fixed normal step size of dVpgm1 is depicted. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 1202, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification.

All memory cells may initially be in the erased state at the beginning of the program operation, for instance. After the program operation is completed, a Vth distribution similar to that in FIG. 8 is achieved, and the data can be read from the memory cells using read voltages which are between the Vth distributions. At the same time, a read pass voltage, Vpass (e.g., 8-10 V), also referred to as pass voltage or turn on voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the Er, A, B, C, D, E, F and G states is 111, 110, 100, 000, 010, 011, 001 and 101, respectively. In each three-bit sequence, the UP bit is followed by the MP bit and then the LP bit. The data of the lower, middle and upper pages can be determined by reading the memory cells using read voltages of VrA and VrE; VrB, VrD and VrF; and VrC and VrG, respectively.

FIG. 12B depicts an example of verify voltages used in different program loops, consistent with FIGS. 12A and 15A, where one set of verify voltages (one verify voltage per assigned data state) is used in a program pass. The horizontal bars of FIGS. 12B and 12C are time-aligned with the program loop axis of FIG. 12A. The set of verify voltages 1210 includes VvA1, VvB1, VvC1, VvD1, VvE1, VvF1 and VvG1 used in program loops 1-7, 2-9, 4-10, 5-12, 7-14, 8-16 and 10-18, respectively. This is an example of a first set of verify voltages.

Figure 16:
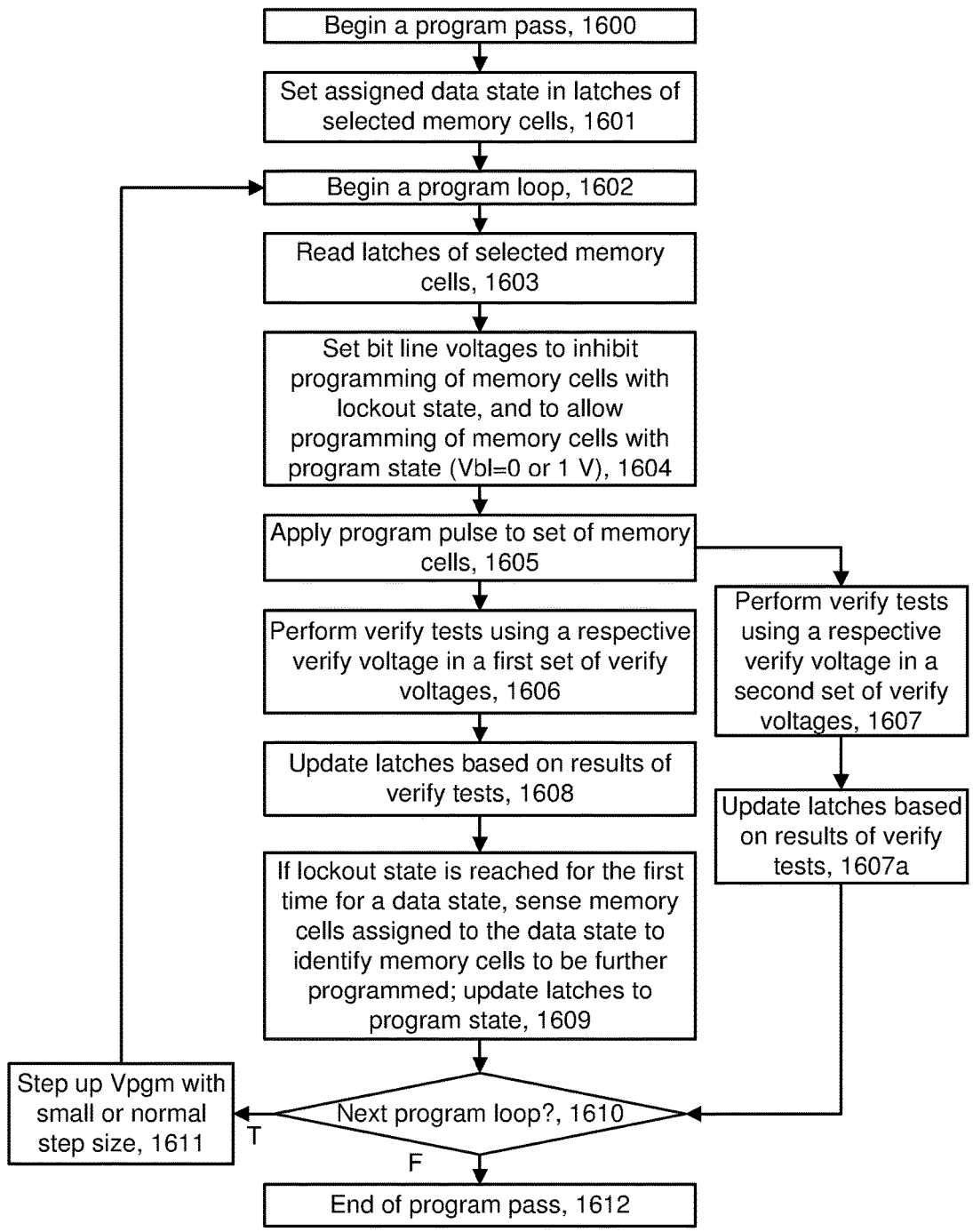
FIG. 16 depicts an example of a program pass in a one-pass program operation, consistent with FIG. 14.

FIG. 12C depicts an example of verify voltages used in different program loops, consistent with FIGS. 12A and 16, where first and second sets of verify voltages (two verify voltages per assigned data state) are used in a program pass, and the second sets of verify voltages are temperature-based. The set of verify voltages 1220 includes VvA1, VvB1, VvC1, VvD1, VvE1, VvF1 and VvG1 used in a first set of program loops 1-5, 2-7, 4-8, 5-9, 7-10, 8-11 and 10-14, respectively. This is an example of a first set of verify voltages. The set of verify voltages 1220 also includes VvA2, VvB2, VvC2, VvD2, VvE2, VvF2 and VvG2 used in a second set of program loops 6-8, 8-10, 9-11, 10-12, 11-13, 12-15 and 15-18, respectively. This is an example of a second set of verify voltages. The verify voltages VvA1-VvG1 may be the same as in FIG. 8, for example.

For an assigned data state, a sensing operation to identify the lower tail memory cells may be performed when transitions from the verify voltage of the first set to the verify voltage of the second set. For example, a sensing operation (denoted by an "S" in FIG. 12C and performed in a sense period 1220a) may be performed at the end of program loop 5, 7, 8, 9, 10, 11 and 14 and before the beginning of program loop 6, 8, 9, 10, 11, 12 and 15, respectively, for the A, B, C, D, E, F and G states, respectively. The sensing operation can be for one or more data states. See FIGS. 12G and 12H for example voltage signals used in program loops 9 and 10, respectively.

Figure 15C:
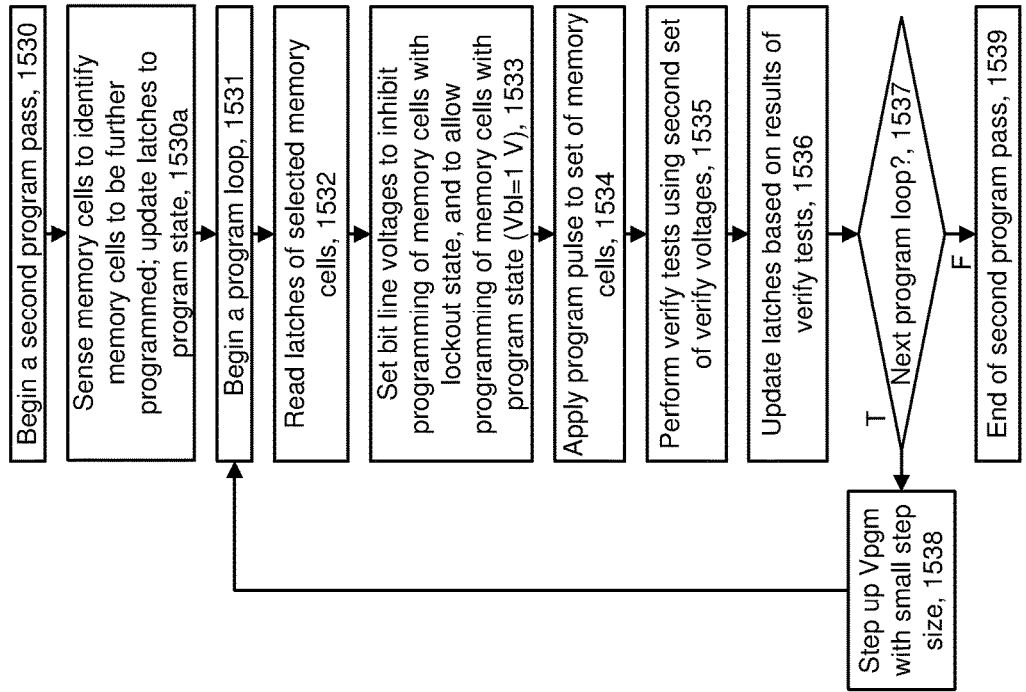
FIG. 15C depicts an example of a second program pass in a multi-pass program operation which follows the first pass of FIG. 15A, consistent with FIG. 14.

FIG. 12D depicts a voltage signal in a program pass, such as a second program pass in a multi-pass program operation, which follows the voltage signal of FIG. 12A, consistent with FIG. 15C. The horizontal axis denotes a program loop number, ranging from 1-22, and the vertical axis denotes voltage. The second program pass may provide a fine (narrower Vth distribution) programming of the lower tail memory cells as compared to a coarse (wider Vth distribution) programming of the remaining memory cells in the first program pass. That is, a control circuit may be configured to provide a narrower threshold voltage distribution width for one portion of the set of memory cells than for a remaining portion of the set of memory cells.

For this reason, there may be more program loops used in the second program pass than in the first, in one example. The initial program pulse magnitude, Vpgm_init may be lower than Vpgm_init1, for example. The step size dVpgm2 may also be smaller than dVpgm1. Another option to provide a narrow Vth distribution width is to increase a bit line voltage (Vbl) of the selected NAND strings which are being programmed. For example, Vbl=1.0 V may be used as compared to Vbl=0 V in the first program pass. This elevated bit line voltage can be a positive voltage which is lower than a Vbl such as 2-3 V which is used to lockout a NAND string from further programming. This elevated Vbl provides a slower programming which results in a narrow Vth distribution width.

The voltage signal 1250 includes a series of program voltages, including an initial program voltage 1251, which are applied to the selected word line. The program voltage (Vpgm) starts at an initial level, Vpgm_init1, and increases using a fixed step size of dVpgm2, for instance. The verify signal in each program loop, including example verify signal 1252, can include one or more verify voltages, based on the assigned data states which are being verified for the program loop.

Figure 12K:
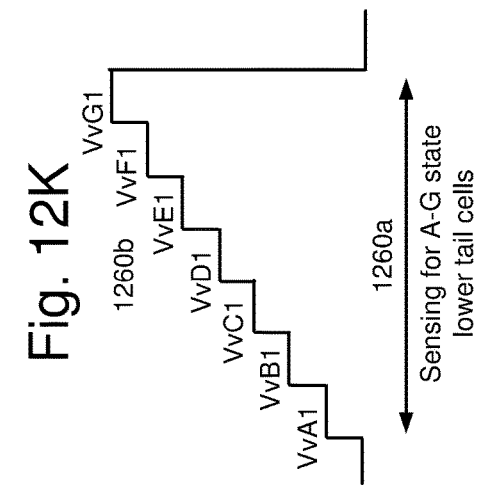
FIG. 12K depicts an example voltage signal in the sense period 1260a of FIG. 12E.

FIG. 12E depicts an example of verify voltages used in different program loops, consistent with FIG. 12A, where one set of temperature-based verify voltages (one verify voltage per assigned data state) is used in the second program pass for programming lower tail memory cells, and where the sensing of the lower tail memory cells occurs at a start of the second program pass. The horizontal bars of FIG. 12E are time-aligned with the program loop axis of FIG. 12D. The set of verify voltages 1260 includes VvA2, VvB2, VvC2, VvD2, VvE2, VvF2 and VvG2 used in program loops 1-9, 3-11, 5-13, 7-15, 9-17, 11-19 and 13-22, respectively. This is an example of a second set of verify voltages. In one approach, after the first program pass and before the second program pass, e.g., at a start of the second program pass, a sensing operation occurs for each assigned programmed data state (as denoted by the sense period 1260a with an "S") to identify the lower tail memory cells. See FIG. 12K. These lower tail memory cells are programmed in the second program pass. In one approach, remaining memory cells (memory cells other than the lower tail memory cells) are not programmed in the second program pass.

FIG. 12F depicts the example verify voltages of FIG. 12E, where the sensing of the lower tail memory cells occurs just before a program loop, for each programmed data state. In this example set of verify voltages 1270, the sensing of the lower tail memory cells occurs at different times in the second program pass, just before a program loop in which verify operations are performed for a given data state. For example, the sensing occurs to identify the lower tail memory cells of the A, B, C, D, E, F and G states occurs just before program loop 1, 3, 5, 7, 9, 11 and 13, respectively. See FIGS. 12I and 12J for example voltage signals used in program loops 6 and 7, respectively. A sensing period 1270a is also depicted in FIG. 12I.

FIG. 12G depicts an example voltage signal 1221 in program loop 9 (PL9) of FIG. 12C, consistent with the sense period 1220a. The voltage signal is applied to the selected word line and includes a program pulse 1221a (Vpgm), a verify signal 1221b used in verify tests and a sensing voltage 1221c (in the sense period 1220a) used for sensing D state lower tail memory cells. The verify voltages are VvB2, VvC2 and VvD1. The B and C state memory cells are therefore verified using a voltage in a second set of verify voltages and the D state memory cells are verified using a voltage in a first set of verify voltages. Additionally, the verify test for the B and C state memory cells is limited to the lower tail B and C state memory cells which have a program status in their latches, while the verify test for the D state memory cells is for all D state memory cells which have a program status in their latches. The sensing voltage 1221c may or may not be considered to be part of PL9.

FIG. 12H depicts an example voltage signal 1222 in program loop 10 (PL10) of FIG. 12C. The voltage signal includes a program pulse 1222a (Vpgm) and a verify signal 1222b. The verify voltages are VvB2, VvC2 and VvD2. The B, C and D state memory cells are therefore verified using a voltage in the second set of verify voltages. Additionally, the verify test for the B, C and D state memory cells is limited to the lower tail B, C and D state memory cells which have a program status in their latches.

FIG. 12I depicts an example voltage signal 1271 in program loop 6 (PL6) of FIG. 12F, consistent with the sense period 1270a. The voltage signal includes a program pulse 1271a (Vpgm), a verify signal 1271b used in verify tests and a sensing signal 1271c or pulse (in the sense period 1270a) used for sensing D state lower tail memory cells. The verify voltages are VvA2, VvB2 and VvC2. The A, B and C state memory cells are therefore verified using a voltage in a second set of verify voltages. Additionally, the verify test for the A, B and C state memory cells is limited to the lower tail A, B and C state memory cells which have a program status in their latches.

FIG. 12J depicts an example voltage signal 1272 in program loop 7 (PL7) of FIG. 12F. The voltage signal includes a program pulse 1272a (Vpgm) and a verify signal 1272b. The verify voltages are VvA2, VvB2, VvC2 and VvD2. The A, B, C and D state memory cells are therefore verified using a voltage in a second set of verify voltages. Additionally, the verify test for the A-D state memory cells is limited to the lower tail A-D state memory cells, respectively, which have a program status in their latches.

FIG. 12K depicts an example voltage signal in the sense period 1260a of FIG. 12E. in this example, a verify signal 1260b includes verify voltages of VvA1-VvG1. The sensing operation can identify the lower tail memory cells of each of the programmed data states in this example.

Figure 13A:
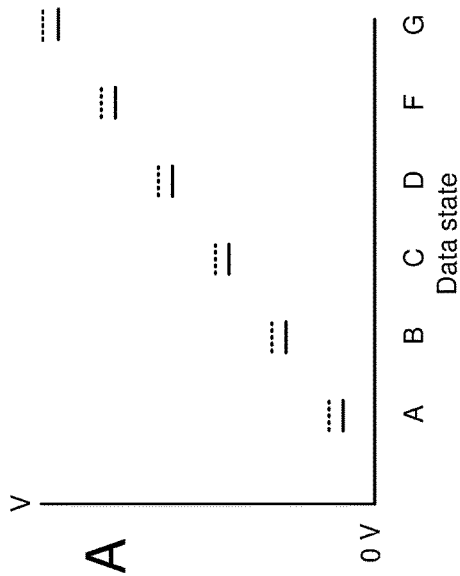
FIG. 13A depicts an example plot of verify voltages versus data states, including a first set of verify voltages (solid lines) for initial programming of a set of memory cells, and a second set of verify voltages for further programming of lower-tail memory cells, where there is a constant increment between the first and second sets of verify voltages.

FIG. 13A depicts an example plot of verify voltages versus data states, including a first set of verify voltages (solid lines) for initial programming of a set of memory cells, and a second set of verify voltages for further programming of lower-tail memory cells (dash-dot lines), where there is a constant increment between the first and second sets of verify voltages. As mentioned, the verify voltage for the further programming of the lower tail memory cells can be higher than the verify voltage for the initial programming of a set of memory cells (which includes the lower tail memory cells and remaining memory cells) when the initial programming occurs when the memory device is cold. Further, as mentioned, the verify voltage for the further programming can be a decreasing function of temperature. This example provides a simpler implementation than FIG. 13B because the second set of verify voltages can be easily calculated using a common increment from the first set of verify voltages for each assigned data state.

Figure 13B:
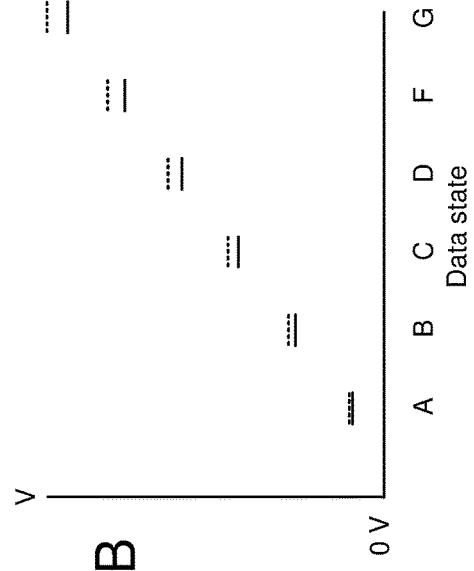
FIG. 13B depicts an example plot of verify voltages versus data states, including a first set of verify voltages (solid lines) for initial programming of a set of memory cells, and a second set of verify voltages for further programming of lower-tail memory cells when a memory device is cold (dotted lines), where the increment between the first and second sets of verify voltages is an increasing function of the data state.

FIG. 13B depicts an example plot of verify voltages versus data states, including a first set of verify voltages (solid lines) for initial programming of a set of memory cells, and a second set of verify voltages for further programming of lower-tail memory cells (dotted lines), where the increment between the first and second sets of verify voltages is an increasing function of the data state. In this example, the verify voltage for the further programming of the lower tail memory cells can be an increasing function of the data state as well as a decreasing function of temperature.

This example provides a custom increment between the first and second sets of verify voltages for each assigned data state. The increment can be larger for higher data states to account for an expected larger amount of charge loss. In this example, an amount by which the second verify voltage (in the second set of verify voltages) exceeds the first verify voltage (in a first set of verify voltages) is relatively large when the assigned data state is a relatively high assigned data (e.g., states E, F and G) state among a plurality of assigned data states (e.g., states Er-G). The first and second sets of verify voltages may be consistent with FIG. 8.

FIG. 14 depicts an example program operation which minimizes Vth widening due to temperature changes. Step 1400 includes performing first programming for a set of memory cells using a first set of verify voltages of assigned data states. The first programming may result in a normal Vth distribution width which does not use a slowdown measure such as a reduced program pulse step size or an elevated bit line voltage. The first programming could include a first program pass as in FIGS. 12A and 12B, or a first set of program loops, as in FIGS. 12A and 12C.

Step 1401 includes, after the first programming, identifying memory cells in the set of memory cells to undergo further programming, for one or more assigned data states. See, e.g., FIGS. 11A and 11D. The identified memory cells could include, e.g., the memory cells 1001, 1005, 1009, 1013, 1017, 1021, 1025 and 1029 in FIG. 10. Step 1402 includes selecting a second set of verify voltages which are higher than the first set of verify voltages for the assigned data states, e.g., based on a decreasing function of temperature. See, e.g., FIGS. 9C, 9G, 13A and 13B. Step 1403 includes performing second programming for the identified memory cells, but not for remaining memory cells, using the second set of verify voltages, thereby providing a narrow Vth distribution. The second programming could include a second program pass as in FIGS. 12D and 12E. The remaining memory cells could include the memory cells could 1002-1004, 1006-1008, 1010-1012, 1014-1016, 1018-1020, 1022-1024, 1026-1028 and 1030-1032 of FIG. 10.

FIG. 15A depicts an example of a first program pass in a multi-pass program operation, consistent with FIG. 14. Step 1500 begins a first program pass. Step 1501 sets an assigned data state in latches of the selected memory cells. See, e.g., FIG. 17A-18B. For example, a host device may identify assigned data states in a program command which is received by the external controller 122. The controller in turn communicates with the circuitry 110 to execute the program command, including writing data into the latches which identifies the assigned data states. Step 1502 begins a program loop. Step 1503 includes reading the latches of the selected memory cells, e.g., to determine whether the memory cells are in a lockout or program state. Step 1504 includes setting bit line voltages to inhibit programming of memory cells with the lockout state, e.g., by setting Vbl=2-3 V, and to allow programming of memory cells with the program state, e.g., by setting Vbl=0 V. Vbl=0 V provides a normal speed programming of the memory cells with a normal Vth distribution width. Step 1505 includes applying a program pulse to the set of memory cells, e.g., via the selected word line. Step 1506 includes performing verify tests for the selected memory cells using a first set of verify voltages. Step 1507 includes updating the latches based on results of the verify tests. For example, the latches can be changed from the program state to the lockout state when the verify test is passed.

A decision step 1508 determines if there is a next program loop. If this is true, step 1509 includes stepping up Vpgm with a normal step size and a next program loop begins at step 1502. If decision step 1508 is false, step 1510 denotes the end of the first program pass. The program pass may end when all or nearly all of the selected memory cells pass their respective verify test.

Figure 15B:
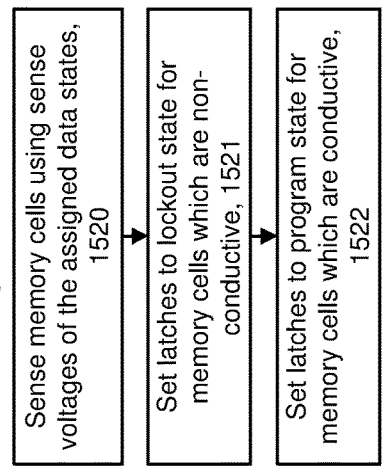
FIG. 15B depicts an example implementation of step 1401 of FIG. 14, which can follow the first program pass of FIG. 15A.

FIG. 15B depicts an example implementation of step 1401 of FIG. 14, which can follow the first program pass of FIG. 15A. Step 1520 includes sensing the memory cells using sense voltages of the assigned data states, such as discussed in connection with FIG. 11A, where the sense voltage for the D state could be VvD1, for instance. Step 1521 includes setting the latches to the lockout state for memory cells which are sensed as being non-conductive. Step 1522 includes setting the latches to the program state for memory cells which are sensed as being conductive.

FIG. 15C depicts an example of a second program pass in a multi-pass program operation which follows the first pass of FIG. 15A, consistent with FIG. 14. Step 1530 begins a second program pass. Step 1530a includes sensing the memory cells to identify memory cells to be further programmed, and updating the latches of these identified memory cells to the program state. In one approach, step 1530a occurs when the temperature is below a specified level (e.g., Tc), this step can identify lower tail memory cells for each of the programmed data states A-G, for example, where the lower tail memory cells are the memory cells to be further programmed. In one embodiment, the sensing occurs when the high-Tco memory cells have a Vth downshift and before many of the normal-Tco memory cells have a Vth downshift, so that the lower tail memory cells will primarily include high-Tco memory cells.

In another embodiment, step 1530a occurs when the temperature is above a specified level (e.g., Th). In this case, step 1530a can identify the upper tail memory cells for each of the programmed data states A-G, for example, where the remaining memory cells are the memory cells to be further programmed.

The latches of the identified memory cells are set to a program state and the latches of the remaining memory cells remain in a lockout state. Step 1531 begins a program loop. Step 1532 includes reading the latches of the selected memory cells, e.g., to determine whether the memory cells are in a lockout or program state. Step 1533 includes setting bit line voltages to inhibit programming of memory cells with the lockout state, e.g., by setting Vbl=2-3 V, and to allow programming of memory cells with the program state, e.g., by setting Vbl=1 V. Vbl=1 V provides a slow speed programming of the identified memory cells to achieve a narrow Vth distribution width. Step 1534 includes applying a program pulse to the set of memory cells. Step 1535 includes performing verify tests for the selected memory cells using a second set of verify voltages. Step 1536 includes updating the latches based on results of the verify tests.

A decision step 1537 determines if there is a next program loop. If this is true, step 1538 includes stepping up Vpgm with a small step size and a next program loop begins at step 1531. If decision step 1537 is false, step 1539 denotes the end of the first program pass. A next program loop occurs when some of the memory cells have not yet reached the lockout state. In some cases, the second program pass is completed when no more than a specified number of memory cells, such as 1% of the memory cells, remain in the program state and have not reached the lockout state, for each programmed data state.

FIG. 16 depicts an example of a program pass in a one-pass program operation, consistent with FIG. 14. Step 1600 begins the program pass. Step 1601 sets an assigned data state in latches of the selected memory cells. Step 1602 begins a program loop. Step 1603 includes reading the latches of the selected memory cells, e.g., to determine whether the memory cells are in a lockout or program state. Step 1604 includes setting bit line voltages to inhibit programming of memory cells with the lockout state, e.g., by setting Vbl=2-3 V, and to allow programming of memory cells with the program state, e.g., by setting Vbl=0 V for a normal programming speed or Vbl=1 V for a slow speed programming, respectively. Initially, Vbl=0 V may be used until the verify test is passed for a data state using a verify voltage in a first set of verify voltages, as mentioned in connection with step 1606. Subsequently, Vbl=1 V may be used. Step 1605 includes applying a program pulse to the set of memory cells. Subsequently, either step 1606 or 1607 can be followed for each data state. Step 1606 is followed if all (or nearly all) of the memory cells have not reached the lockout state using a verify voltage in a first set of verify voltages. Step 1607 is followed if all (or nearly all) of the memory cells have reached the lockout state using the verify voltage in the first set of verify voltages.

Step 1606 includes performing verify tests using a respective verify voltage in a first set of verify voltages. Step 1608 includes updating the latches based on results of the verify tests. At step 1609, if the verify test of step 1606 indicates that the memory cells have all reached the lockout state for the first time when being verified using a verify voltage in a first set of verify voltages, the memory cells assigned to the data state are sensed to identify the memory cells to be further programmed. Step 1609 also includes updating the latches to the program state to indicate that identified memory cells should undergo further programming using a temperature-based verify voltage, e.g., a verify voltage in a second set of verify voltages. That is, the latches will be updated from the lockout state to the program state for the identified memory cells while the latches of the remaining memory cells remain in the lockout state.

As in FIG. 15C, step 1530a, with T<Tc, the sensing of step 1609 may occur when the high-Tco memory cells with a particular assigned data state have a Vth downshift and before many of the normal-Tco memory cells with the particular assigned data state have a Vth downshift, so that the lower tail memory cells will primarily include high-Tco memory cells of the particular assigned data state, in one embodiment.

Step 1607 involves performing verify tests using a respective verify voltage in a second set of verify voltages. In some cases, in a given program loop, step 1606 is performed for memory cells assigned to one data state, and step 1607 is performed for memory cells assigned to another data state. Step 1607a involves updating the latches based on results of the verify tests of step 1607. The latches are updated from the program state to the lockout state for memory cells which pass a verify test.

A decision step 1610 determines if there is a next program loop. If this is true, step 1611 includes stepping up Vpgm with a small or normal step size (when the condition is not met or met, respectively) and a next program loop begins at step 1602. If decision step 1610 is false, step 1612 denotes the end of the first program pass. The narrow Vth distribution can be achieved by using the normal step size throughout the program pass while using an elevated Vbl to slow down programming for memory cells of data states for which the condition of step 1606 is met. Since all selected memory cells received the same program pulse, this approach avoids slowing down the programming of the memory cells of data states for which the condition of step 1606 is not yet met.

FIG. 17A depicts an example of bit values in latches at a start of a program pass, consistent with FIG. 14-16. As mentioned, e.g., in connection with FIGS. 2 and 15A-16, a set of latches can be associated with each NAND string and thus with each selected memory cell being programmed. A bit combination stored in the latches can identify the assigned data state and/or indicate that the memory cell is in a lockout or program state. The bit combinations of 111, 110, 100, 000, 010, 011, 001 and 101 identify the Er, A, B, C, D, E, F and G states, respectively, as assigned data states. The bit combination of 111 also identifies the lockout state. During programming, when the memory cells reach their respective lockout state, the bit combination can be changed to 111 as indicated in FIG. 17B FIG. 17B depicts bit values in latches at a completion of a program operation, consistent with FIG. 17A. As mentioned, the bit combination 111 denotes the lockout state.

FIG. 18A depicts an example of bit values in latches at a start of a first program pass, consistent with FIG. 14-16. This example adds the LO bit to identify a lockout or program status. During a first program pass, for example, the LO bit may be changed from 0 to 1, for example, when the respective memory cell reaches the lockout state using the first set of verify voltages. At the end of the first pass, the sensing of FIG. 15B occurs. The LO bit can be changed from 1 (lockout) to 0 (program) for the memory cells to be further programmed. Subsequently, in the second program pass, the LP, MP and UP latches continue to identify the assigned data state so that the memory cells with LO=0 can be verified against the appropriate verify voltage in the second set of verify voltages. The memory cells with LO=1 can remain in the lockout state in the second program pass.

Or, during a single pass program operation, the LO bit may be changed from 0 to 1, for example, when the respective memory cell reaches the lockout state using the first set of verify voltages. A sensing operating then occurs, as in step 1609 of FIG. 16. Based on the sensing, some of the memory cells may remain in the lockout state and other memory cells may have a Vth below the sense voltage and therefore be identified for further programming. The LO bit can be changed from 1 (lockout) to 0 (program) for these identified memory cells. Subsequently, the LP, MP and UP latches continue to identify the assigned data state so that the memory cells with LO=0 can be verified against the appropriate verify voltage in the second set of verify voltages, and the memory cells with LO=1 can remain in the lockout state.

FIG. 18B depicts an example of bit values in latches at a completion of the program operation, consistent with FIGS. 14-16 and 18A. When all of the memory cells have passed the respective verify test, the LO bits will be 1's.

In one implementation, an apparatus comprises: a set of memory cells arranged in NAND strings, the set of memory cells having an assigned data state; a temperature-sensing circuit configured to provide an output indicative of a temperature; and a control circuit configured to program the set of memory cells using a first verify voltage of the assigned data state and in response to determining that the temperature is below a specified temperature, identify one portion of the set of memory cells having a threshold voltage at a lower tail of a threshold voltage distribution of the set of memory cells, and program the one portion of the set of memory cells but not a remaining portion of the set of memory cells using a second verify voltage of the assigned data state, wherein the second verify voltage is higher than the first verify voltage.

In another implementation, a method comprises: performing a first set of program loops for a set of memory cells, the set of memory cells have an assigned data state represented by a threshold voltage distribution after the first set of program loops; identifying a first subset of the memory cells at a lower tail of the threshold voltage distribution; and performing a second set of program loops for the first subset of the memory cells, wherein a verify voltage used in the second set of program loops is higher than a verify voltage used in the first set of program loops, and an amount by which the verify voltage used in the second set of program loops is higher than the verify voltage used in the first set of program loops is based on a temperature.

In another implementation, an apparatus comprises: a set of memory cells, the memory cells are arranged in NAND strings, each NAND string comprising a polysilicon channel, the set of memory cells comprises selected memory cells; means for providing an output indicative of a temperature; means for determining that the temperature is above a specified temperature; means for programming the set of memory cells using a first verify voltage, the set of memory cells having a threshold voltage distribution; means for identifying a subset of the set of memory cells which has a threshold voltage below a specified level, in response to the means for determining that the temperature is above the specified temperature; and means for further programming the subset of the set of memory cells without further programming of a remaining portion of the set of memory cells, in response to the means for determining that the temperature is above the specified temperature, the remaining portion has a threshold voltage above the specified level.

The subset of the set of memory cells may be further programmed to a threshold voltage distribution which encompasses a threshold voltage distribution of the remaining portion of the set of memory cells. The subset of the set of memory cells may be further programmed to a median threshold voltage distribution which exceeds a median threshold voltage distribution of the remaining portion of the set of memory cells. The subset of the set of memory cells may comprise more than half of the set of memory cells.

The means for providing an output indicative of a temperature and the means for determining that the temperature is below a specified temperature may include the temperature-sensing circuit 117 of FIGS. 1A and 1B.

The means for programming the set of memory cells and the means for further programming memory cells may include the controller 122, control circuitry 110, including the power control module 116, sense blocks 51-53, verify voltage setting circuit 119, row decoder 124 and read/write circuits 128 of FIGS. 1A and 2, or other logic hardware, and/or other executable code stored on a computer readable storage medium or device. Other embodiments may include similar or equivalent means.

The means for identifying memory cells may include the controller 122, control circuitry 110, including the power control module 116, sense blocks 51-53, row decoder 124 and read/write circuits 128 of FIGS. 1A and 2, or other logic hardware, and/or other executable code stored on a computer readable storage medium or device. Other embodiments may include similar or equivalent means.

The means for further programming may provide a smaller program pulse step size (e.g., dVpgm2) than the means for programming the set of memory cells (which uses a larger program pulse step size of dVpgm1). The means for further programming may provide a higher voltage for bit lines (e.g., 1 V) connected to the set of memory cells than the means for programming the set of memory cells (which uses a smaller Vbl of, e.g., 0 V).

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells arranged in NAND strings, the set of memory cells having an assigned data state;
a temperature-sensing circuit configured to provide an output indicative of a temperature; and
a control circuit configured to program the set of memory cells using a first verify voltage of the assigned data state and in response to determining that the temperature is below a specified temperature, identify one portion of the set of memory cells having a threshold voltage at a lower tail of a threshold voltage distribution of the set of memory cells, and program the one portion of the set of memory cells but not a remaining portion of the set of memory cells using a second verify voltage of the assigned data state, wherein the second verify voltage is higher than the first verify voltage, wherein:
the programming of the set of memory cells using the first verify voltage occurs in one program pass; and
the programming of the one portion of the set of memory cells using the second verify voltage occurs in another program pass, after the one program pass.

2. The apparatus of claim 1, wherein:
an amount by which the second verify voltage is higher than the first verify voltage is a decreasing function of the temperature.

3. The apparatus of claim 1, wherein:
an amount by which the second verify voltage exceeds the first verify voltage is relatively large when the assigned data state is a relatively high assigned data state among a plurality of assigned data states.

4. The apparatus of claim 1, wherein:
the one portion of the set of memory cells is programmed to a median threshold voltage distribution which is above a median threshold voltage distribution of the remaining portion of the set of memory cells.

5. The apparatus of claim 1, wherein:
the first verify voltage is independent of the temperature.

6. The apparatus of claim 1, wherein in the one program pass:
the control circuit is configured to transition from the programming of the set of memory cells using the first verify voltage to the programming of the one portion of the set of memory cells using the second verify voltage when a lockout state is reached by the set of memory cells using the first verify voltage in the one program pass.

7. The apparatus of claim 1, wherein:
the second verify voltage is relatively greater when a number of program-erase cycles of the set of memory cells is relatively greater.

8. The apparatus of claim 1, wherein:
the control circuit is configured to provide a narrower threshold voltage distribution width for the one portion of the set of memory cells than for the remaining portion of the set of memory cells.

9. The apparatus of claim 1, wherein:
a smaller program pulse step size is used in the programming of the one portion of the set of memory cells than in the programming of the set of memory cells.

10. A method, comprising:
performing a first set of program loops for a set of memory cells having an assigned data state using a first verify voltage of the assigned data state, the set of memory cells having a threshold voltage distribution after the first set of program loops;
identifying a first subset of the set of memory cells at a lower tail of the threshold voltage distribution; and
performing a second set of program loops for the first subset of the set of memory cells but not for a remaining portion of the set of memory cells using a second verify voltage of the assigned data state, wherein the second verify voltage used in the second set of program loops is higher than the first verify voltage used in the first set of program loops, and the first set of program loops and the second set of program loops are performed in one program pass.

11. The method of claim 10, wherein:
an amount by which the second verify voltage used in the second set of program loops is higher than the first verify voltage used in the first set of program loops is relatively high when a temperature is relatively low.

12. The method of claim 10, wherein:
a median threshold voltage distribution of the first subset of the memory cells is above a median threshold voltage distribution of the remaining portion of the set of memory cells.

13. The method of claim 10, wherein:
an amount by which the second verify voltage used in the second set of program loops is higher than the first verify voltage used in the first set of program loops is a decreasing function of a temperature.

14. The method of claim 10, wherein:
an amount by which the second verify voltage used in the second set of program loops is higher than the first verify voltage used in the first set of program loops is based on a temperature.

15. The method of claim 10, further comprising:
in the one program pass, transitioning from the first set of program loops using the first verify voltage to the second set of program loops using the second verify voltage when a lockout state is reached by the set of memory cells using the first verify voltage.

16. The method of claim 10, further comprising:
applying a higher voltage to bit lines connected to the first subset of the set of memory cells during program pulse in the second set of program loops than during program pulses in the first set of program loops.

17. An apparatus, comprising:
a set of memory cells, the memory cells are arranged in NAND strings, each NAND string comprising a polysilicon channel, the set of memory cells comprises selected memory cells;
means for providing an output indicative of a temperature;
means for determining that the temperature is above a specified temperature;
means for programming the set of memory cells using a first verify voltage, the set of memory cells having a threshold voltage distribution;
means for identifying a subset of the set of memory cells which has a threshold voltage below a specified level, in response to the means for determining that the temperature is above the specified temperature; and
means for further programming the subset of the set of memory cells without further programming of a remaining portion of the set of memory cells, in response to the means for determining that the temperature is above the specified temperature, the remaining portion has a threshold voltage above the specified level.

18. The apparatus of claim 17, wherein:
the subset of the set of memory cells are further programmed to a threshold voltage distribution which encompasses a threshold voltage distribution of the remaining portion of the set of memory cells.

19. The apparatus of claim 17, wherein:
the subset of the set of memory cells are further programmed to a median threshold voltage distribution which exceeds a median threshold voltage distribution of the remaining portion of the set of memory cells.

20. The apparatus of claim 17, wherein:
the subset of the set of memory cells comprises more than half of the set of memory cells.

* * * * *